United States Patent
Kurahashi et al.

(10) Patent No.: US 7,495,263 B2
(45) Date of Patent: Feb. 24, 2009

(54) SEMICONDUCTOR LIGHT-EMITTING DEVICE AND MANUFACTURING METHOD THEREFOR

(75) Inventors: Takahisa Kurahashi, Kashiba (JP); Hiroyuki Hosoba, Souraku-gun (JP); Hiroshi Nakatsu, Tenri (JP); Tetsurou Murakami, Tenri (JP); Shouichi Ohyama, Ikoma-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 263 days.

(21) Appl. No.: 09/778,045

(22) Filed: Feb. 7, 2001

(65) Prior Publication Data
US 2001/0020699 A1 Sep. 13, 2001

(30) Foreign Application Priority Data

Feb. 7, 2000 (JP) ............................ 2000-029030
Dec. 7, 2000 (JP) ............................ 2000-372776

(51) Int. Cl.
*H01L 33/00* (2006.01)
*H01L 31/0328* (2006.01)

(52) U.S. Cl. ............. 257/95; 257/E33.074; 372/45.012

(58) Field of Classification Search .................. 257/95, 257/98, E33.027, E33.068, E33.074; 372/44, 372/45, 96, 44.01, 45.012
See application file for complete search history.

(56) References Cited

U.S. PATENT DOCUMENTS

| | | | |
|---|---|---|---|
| 5,132,751 A | 7/1992 | Shibata et al. | |
| 5,255,278 A | 10/1993 | Yamanaka | |
| 5,426,657 A | 6/1995 | Vakhshoori | |
| 5,491,710 A | 2/1996 | Lo | |
| 5,555,255 A | 9/1996 | Kock et al. | |
| 5,779,924 A | 7/1998 | Krames et al. | |
| 5,966,399 A | 10/1999 | Jiang et al. | |
| 6,055,262 A | 4/2000 | Cox et al. | |
| 6,167,071 A | 12/2000 | Hayakawa | |
| 6,350,997 B1 * | 2/2002 | Saeki | 257/102 |
| 6,504,180 B1 | 1/2003 | Heremans et al. | 257/98 |

FOREIGN PATENT DOCUMENTS

| | | |
|---|---|---|
| JP | 56-120174 | 9/1981 |
| JP | 57-106246 | 6/1982 |
| JP | 4-42582 | 2/1992 |
| JP | 04-100277 | 4/1992 |

(Continued)

OTHER PUBLICATIONS

U.S. Appl. No. 09/645,571 filed Aug. 25, 2000.

*Primary Examiner*—Lynne A. Gurley
*Assistant Examiner*—Colleen A. Matthews
(74) *Attorney, Agent, or Firm*—Nixon & Vanderhye P.C.

(57) ABSTRACT

On a GaAs substrate (1), are formed a DBR (Distributed Bragg Reflector) (3), and a light-emitting layer (5) made of a plurality of layers of $Al_yGa_zIn_{1-y-z}P$ ($0 \leq y \leq 1$, $0 \leq z \leq 1$) above the DBR (3). A semiconductor layer or a plurality of semiconductor layers (6)-(10) having a number of layers of 1 or more are formed on the light-emitting layer (5), and a grating pattern for scattering light is formed on a surface of the semiconductor layer (9) by photolithography and by etching with a sulfuric acid/hydrogen peroxide based etchant. Thus, a semiconductor device small in radiation angle dependence of light emission wavelength, as well as a manufacturing method therefor, are provided.

18 Claims, 24 Drawing Sheets

FOREIGN PATENT DOCUMENTS

| | | |
|---|---|---|
| JP | 05-167101 | 7/1993 |
| JP | 07-162037 | 6/1995 |
| JP | 08-102548 | 4/1996 |
| JP | 10-004209 | 1/1998 |
| JP | 11-274568 | 10/1999 |

* cited by examiner

SEMICONDUCTOR LIGHT-EMITTING DEVICE AND MANUFACTURING METHOD THEREFOR

BACKGROUND OF THE INVENTION

The present invention relates to a semiconductor light-emitting device to be used for transmission (in particular, for IEEE 1394), display and the like.

In recent years, semiconductor light-emitting devices have been widely used for optical communications, information display panels and the like. These semiconductor light-emitting devices, for which high luminous efficiency and besides, for optical communications use, high response speed are of importance, have been vigorously developed in these years.

Recently, plastic optical fibers have begun to be used for communications of shorter distances. Since these plastic optical fibers have low loss at a wavelength region of 650 nm, there have been developed fast response LEDs (Light-Emitting Diodes) having, as a light-emitting layer, an AlGaInP based semiconductor material capable of high-efficiency light emission at this wavelength region.

On the other hand, as one of the means for improving the response and luminous efficiency of normal plane emission type LEDs, it has been practiced to fabricate the light-emitting layer into a quantum well structure. Further, as a means for improving the light takeout efficiency, it has been practiced to provide a DBR (Distributed Bragg Reflector) having high reflectance between the light-emitting layer and a GaAs substrate.

However, in the plane emission type LED with the DBR provided under the light-emitting layer, given a light-emitting layer which is a quantum well active layer, the light-emitting layer is so thin as about 10 nm that light reflected from the DBR would not be well absorbed by the light-emitting layer but be radiated outside the LED. As a result, the characteristic of the DBR that the wavelength of perpendicularly reflected light is longer than the wavelength of obliquely reflected light is reflected on the LED, causing the emission wavelength of the LED to have a radiation angle dependence, which is generally about 0.2-0.3 nm/deg. However, even such a level of radiation angle dependence, with the LED used for display, would result in a problem that color changes occur depending on the angle of view.

With the LED used as a light source for communications, when the LED chip is fabricated so as to have a light-emission wavelength peak at, for example, the wavelength region of 650 nm at which plastic optical fibers connected perpendicularly have low loss, then there would occur a problem that obliquely directed outgoing light have a peak wavelength shorter than 650 nm so as to be unusable.

SUMMARY OF THE INVENTION

Therefore, an object of the present invention is to provide a semiconductor light-emitting device which can reduce the radiation angle dependence of emission wavelength by providing a means that multi-directionally scatters light emitted from the light-emitting layer of the semiconductor light-emitting device and put out from the surface, as well as to provide a manufacturing method which allows this semiconductor light-emitting device to be manufactured simply.

In order to achieve the above object, there is provided a semiconductor light-emitting device having a DBR (Distributed Bragg Reflector) and a light-emitting layer formed on a GaAs substrate, the DBR being located between the GaAs substrate and the light-emitting layer, in which light directed from the light-emitting layer toward a top surface has a radiation angle dependence, the semiconductor light-emitting device further comprising:

a semiconductor layer having a number of layers of 1 or more is formed on the light-emitting layer, a top surface of the semiconductor layer being a roughened surface.

In this semiconductor light-emitting device, since the surface of the semiconductor light-emitting device is a roughened surface as illustrated in FIG. 1B, light emitted from the light-emitting layer and going outside from the surface of the semiconductor light-emitting device is scattered in multiple directions, thus allowing a reduction in the radiation angle dependence of emission wavelength of the semiconductor light-emitting device, compared with the case in which the surface is a flat surface as illustrated in FIG. 1A. Generally, in semiconductor light-emitting devices having a DBR between light-emitting layer and substrate, there occurs interference between light put out from the light-emitting layer and light reflected by the DBR, or between light reflected by the DBR and light reflected by the device surface or light re-reflected by the DBR, giving rise to ripples in the emission spectrum as shown in FIG. 24. In the semiconductor light-emitting device described above, on the other hand, since the surface of the semiconductor layer formed on the light-emitting layer is a roughened surface, the outgoing light is scattered by this roughened surface, so that the ripples are reduced, resulting in a averaged, smoothed spectrum distribution as shown in FIG. 25. Therefore, in this semiconductor light-emitting device, variations in device characteristics such as peak wavelength and emission half-value width can be reduced.

In one embodiment of the present invention, the light-emitting layer to be formed on the GaAs substrate is a single layer or a plurality of layers made of $Al_yGa_zIn_{1-y-z}P$ ($0 \leq y \leq 1$, $0 \leq z \leq 1$).

In this semiconductor light-emitting device, since the light-emitting layer is a single layer or a plurality of layers made of $Al_yGa_zIn_{1-y-z}P$ ($0 \leq y \leq 1$, $0 \leq z \leq 1$), light emission having a peak wavelength of 560 nm-660 nm or so can be achieved.

In one embodiment of the present invention, the semiconductor layer whose top surface is a roughened surface is made of $Al_xGa_{1-x}As$ ($0 \leq x \leq 1$)

In this semiconductor light-emitting device, since the semiconductor layer whose top surface is to be formed into a roughened surface during the manufacture is made of $Al_xGa_{1-x}As$ ($0 \leq x \leq 1$), etching is facilitated as compared with the case in which other materials are used for this semiconductor layer.

In one embodiment of the present invention, the semiconductor layer made of $Al_xGa_{1-x}As$ ($0 \leq x \leq 1$) is transparent to an emission wavelength.

In this semiconductor light-emitting device, since the semiconductor layer made of $Al_xGa_{1-x}As$ ($0 \leq x \leq 1$), which is the top layer, is transparent to the emission wavelength, the outgoing light is less likely to be absorbed, so that a large optical output can be obtained.

In one embodiment of the present invention, the semiconductor layer made of $Al_xGa_{1-x}As$ ($0 \leq x \leq 1$) has an Al mixed crystal ratio x of 0.5-0.8.

When the Al mixed crystal ratio x of $Al_xGa_{1-x}As$ ($0 \leq x \leq 1$), which is the material of the semiconductor layer, is less than 0.5, the transparency of the semiconductor layer is lowered, so that enough optical output cannot be obtained. On the other hand, when the Al mixed crystal ratio is not less than 0.8, there occurs some problem to the moisture resistance of the semiconductor layer due to Al oxide. However, this semiconductor light-emitting device is free from the problems of optical output insufficiency and moisture resistance reduction by virtue of the Al mixed crystal ratio x of $Al_xGa_{1-x}As$ ($0 \leq x \leq 1$) being set to 0.5-0.8.

In one embodiment of the present invention, the semiconductor device further comprises an $Al_yGa_zIn_{1-y-z}P$ ($0 \leq y \leq 1$, $0 \leq z \leq 1$) layer for diffusing a current injected from an electrode provided on a light takeout side, the $Al_yGa_zIn_{1-y-z}P$ layer being provided between the semiconductor layer made of $Al_xGa_{1-x}As$ ($0 \leq x \leq 1$) and the light-emitting layer.

In this semiconductor light-emitting device, since the semiconductor layer whose top surface is to be formed into a roughened surface during the manufacture is made of $Al_xGa_{1-x}As$ ($0 \leq x \leq 1$), etching is facilitated as compared with the case in which other materials are used for this semiconductor layer. Besides, since the current diffusion layer made of $Al_yGa_zIn_{1-y-z}P$ ($0 \leq y \leq 1$, $0 \leq z \leq 1$) is provided between the semiconductor layer and the light-emitting layer, the thickness of the layer made of $Al_xGa_{1-x}As$ ($0 \leq x \leq 1$) is thinned so that the absorption of outgoing light can be reduced. Thus, emitted light having shorter-wavelength around 560 nm can be put out successfully.

In one embodiment of the present invention, the layer whose top surface is a roughened surface is made of $Al_yGa_zIn_{1-y-z}P$ ($0 \leq y \leq 1$, $0 \leq z \leq 1$).

In this semiconductor light-emitting device, since the layer whose top surface is a roughened surface is made of $Al_yGa_zIn_{1-y-z}P$ ($0 \leq y \leq 1$, $0 \leq z \leq 1$), emitted light having shorter peak wavelengths around 560 nm is less absorbed and put out successfully.

In one embodiment of the present invention, the layer whose top surface is a roughened surface has a lattice constant different by 0.5% or more from that of the GaAs substrate.

In this semiconductor light-emitting device, the layer of $Al_yGa_zIn_{1-y-z}P$ ($0 \leq y \leq 1$, $0 \leq z \leq 1$) whose top surface is to be formed into roughened surface during the manufacture has a lattice constant different by 0.5% or more from that of the GaAs substrate. Based on the difference in lattice constant, the wafer surface can be roughened only by a sequence of crystal growth. Therefore, the step of separately roughing the wafer surface after the crystal growth can be eliminated, so that the manufacture can be further simplified.

Also, there is provided a method for manufacturing a semiconductor light-emitting device having a DBR (Distributed Bragg Reflector) and a light-emitting layer formed on a GaAs substrate, the DBR being located between the GaAs substrate and the light-emitting layer, in which light directed from the light-emitting layer toward a top surface has a radiation angle dependence, the semiconductor light-emitting device manufacturing method comprising the steps of:

forming a semiconductor layer having a number of layers of 1 or more on the light-emitting layer; and thereafter roughing a wafer surface.

In this method for manufacturing a semiconductor light-emitting device, after forming the semiconductor layer having a number of layers of 1 or more on the light-emitting layer, only the wafer surface is roughened and inner layers are not roughened. Therefore, light emitted from the light-emitting layer and going outside from the surface of the semiconductor light-emitting device is scattered in multiple directions without lowering the reflectance of the DBR. Thus, the radiation angle dependence of emission wavelength of the semiconductor light-emitting device can be reduced.

In one embodiment of the present invention, the step of roughing the wafer surface includes a step of forming a pattern for scattering light onto the wafer surface by photolithography and etching.

In this method for manufacturing a semiconductor light-emitting device, since the pattern for scattering light is formed on the wafer surface by photolithography and etching, a fine, high-precision pattern can be formed.

In one embodiment of the present invention, the step of roughing the wafer surface includes a step of abrasion the wafer surface.

In this method for manufacturing a semiconductor light-emitting device, since the wafer surface is roughened by abrasion, such a complex photolithography step as would be involved in the foregoing semiconductor light-emitting device manufacturing methods is eliminated. Therefore, the semiconductor light-emitting device can be manufactured by a simpler method.

In one embodiment of the present invention, the step of forming the semiconductor layer having a number of layers of 1 or more on the light-emitting layer includes a step of forming a semiconductor layer including an $Al_yGa_zIn_{1-y-z}P$ ($0 \leq y \leq 1$, $0 \leq z \leq 1$) layer, and the step of roughing the wafer surface includes a step of boiling the wafer in hydrochloric acid.

In this method for manufacturing a semiconductor light-emitting device, since the wafer surface is roughened by boiling the wafer in hydrochloric acid, the step of sticking the wafer for its surface roughing to an additional substrate or sheet or the like for wafer holding as well as the step of cleaning the wafer can be eliminated. Therefore, the semiconductor light-emitting device manufacturing method can be further simplified.

Also, there is provided a method for manufacturing a semiconductor light-emitting device having a DBR (Distributed Bragg Reflector) and a light-emitting layer formed on a GaAs substrate, the DBR being located between the GaAs substrate and the light-emitting layer, in which light directed from the light-emitting layer toward a top surface has a radiation angle dependence, the semiconductor light-emitting device manufacturing method comprising the steps of:

forming on the light-emitting layer a semiconductor layer having a number of layers of 1 or more including an $Al_yGa_zIn_{1-y-z}P$ ($0 \leq y \leq 1$, $0 \leq z \leq 1$) layer having a lattice constant different by 0.5% or more from the GaAs substrate, thereby roughing a wafer surface.

In this method for manufacturing a semiconductor light-emitting device, the surface of the semiconductor layer formed on one side of the light-emitting layer opposite to the side on which the GaAs substrate is provided is roughened due to the lattice constant difference. Therefore, since wafer surface can be roughened only by a sequence of crystal growth, the step of separately roughing the wafer surface after the crystal growth can be eliminated, so that the manufacture method can be made further simpler than the foregoing manufacturing methods.

In one embodiment of the present invention, the step of forming on the light-emitting layer a semiconductor layer having a number of layers of 1 or more includes a step of forming on the light-emitting layer a semiconductor layer including an $Al_yGa_zIn_{1-y-z}P$ ($0 \leq y \leq 1$, $0 \leq z \leq 1$) layer and an $Al_xGa_{1-x}As$ ($0 \leq x \leq 1$) layer, and the step of roughing the wafer surface includes a step of treating with dilute hydrofluoric acid or dilute nitric acid.

In this method for manufacturing a semiconductor light-emitting device, the surface of the $Al_xGa_{1-x}As$ ($0 \leq x \leq 1$) layer can be roughened more simply by treating (etching) with dilute hydrofluoric acid or dilute nitric acid. Besides, emitted light having shorter-wavelength around 560 nm can be put out successfully.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail by way of embodiments thereof illustrated in the accompanying drawings.

Embodiment 1

Figure 1B:
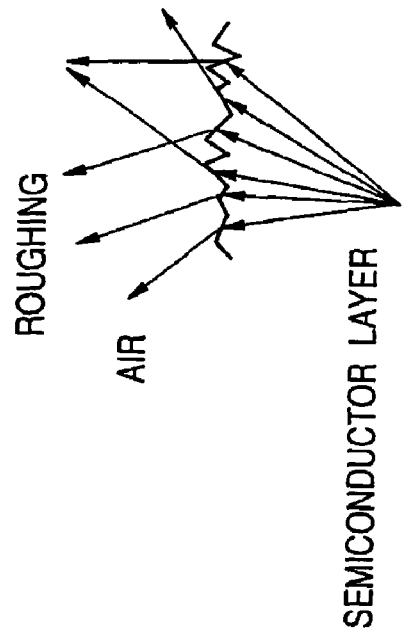
FIGS. 1A and 1B are schematic views showing light scattering by the roughening of a wafer surface in comparison with a flat surface.
Figure 1A:
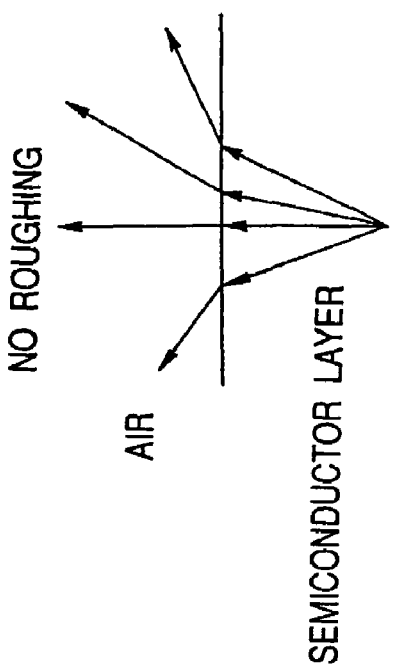
Figure 2A:
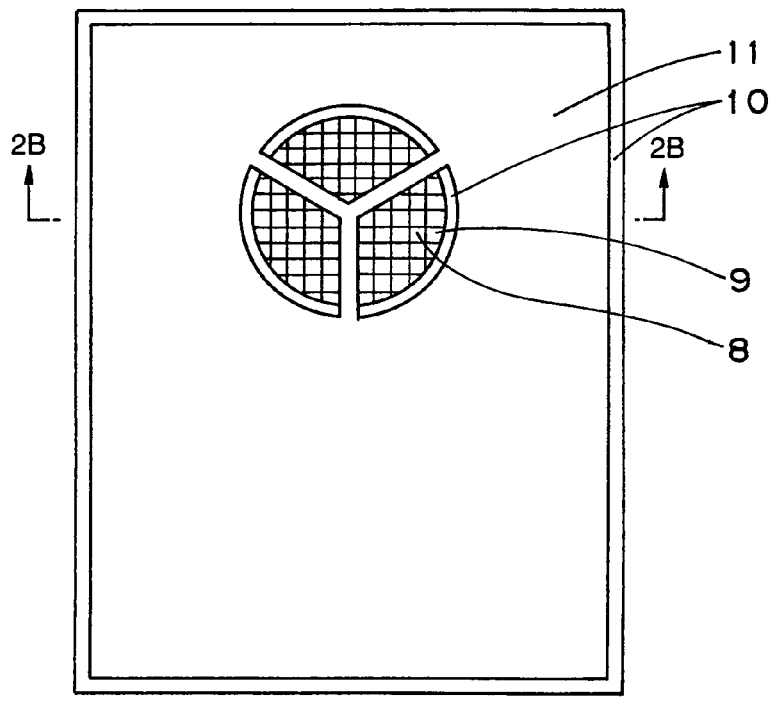
FIGS. 2A and 2B are a plan view and its sectional view taken along the line 2B-2B, respectively, of a semiconductor light-emitting device according to a first embodiment of this invention.
Figure 2B:
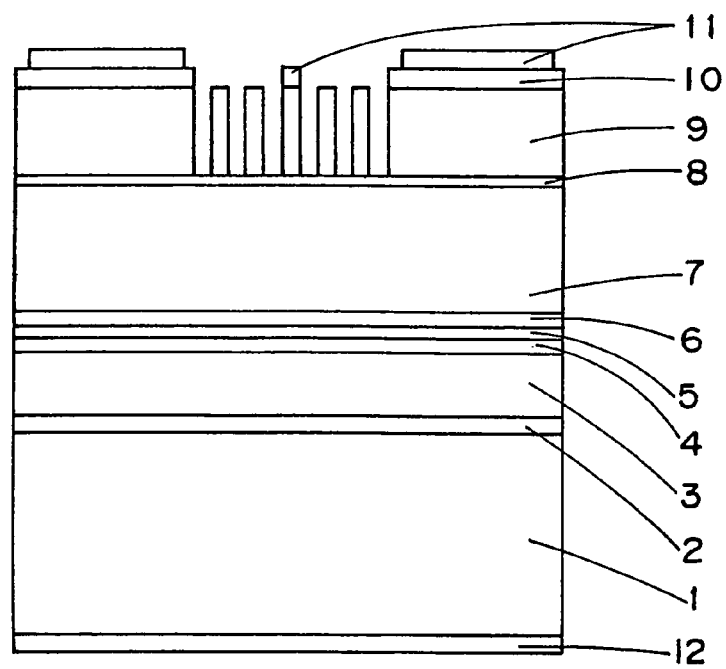

FIGS. 2A and 2B are a plan view and its sectional view taken along the line 2B-2B, respectively, of an AlGaInP based semiconductor light-emitting device which is a first embodiment of the present invention. In FIGS. 2A and 2B, reference numeral 1 denotes an n-type GaAs substrate, 2 denotes an n-type GaAs buffer layer, 3 denotes a DBR (Distributed Bragg Reflector) formed by stacking 20 pairs of layers of n-type $Al_{0.5}In_{0.5}P$ and n-type $(Al_{0.2}Ga_{0.8})_{0.5}In_{0.5}P$ alternately, 4 denotes a first cladding layer made of n-type $Al_{0.5}In_{0.5}P$, 5 denotes a 80 Å thick quantum well active layer formed with a GaInP well layer sandwiched by $(Al_{0.5}Ga_{0.5})_{0.5} In_{0.5}P$ barrier layers, 6 denotes a second cladding layer made of p-type $Al_{0.5}In_{0.5}P$, 7 denotes current diffusion layer made of p-type $Al_{0.5}Ga_{0.5}As$, 8 denotes an etching stopping layer made of p-type $(Al_{0.2}Ga_{0.8})_{0.5}In_{0.5}P$, 9 denotes a light scattering layer made of p-type $Al_{0.5}Ga_{0.5}As$, 10 denotes a $SiO_2$ film, 11 denotes a p-type electrode, which includes a plurality of separate apertures to expose different parts of the light scattering layer and 12 denotes an n-type electrode of the substrate rear surface.

Figure 3:
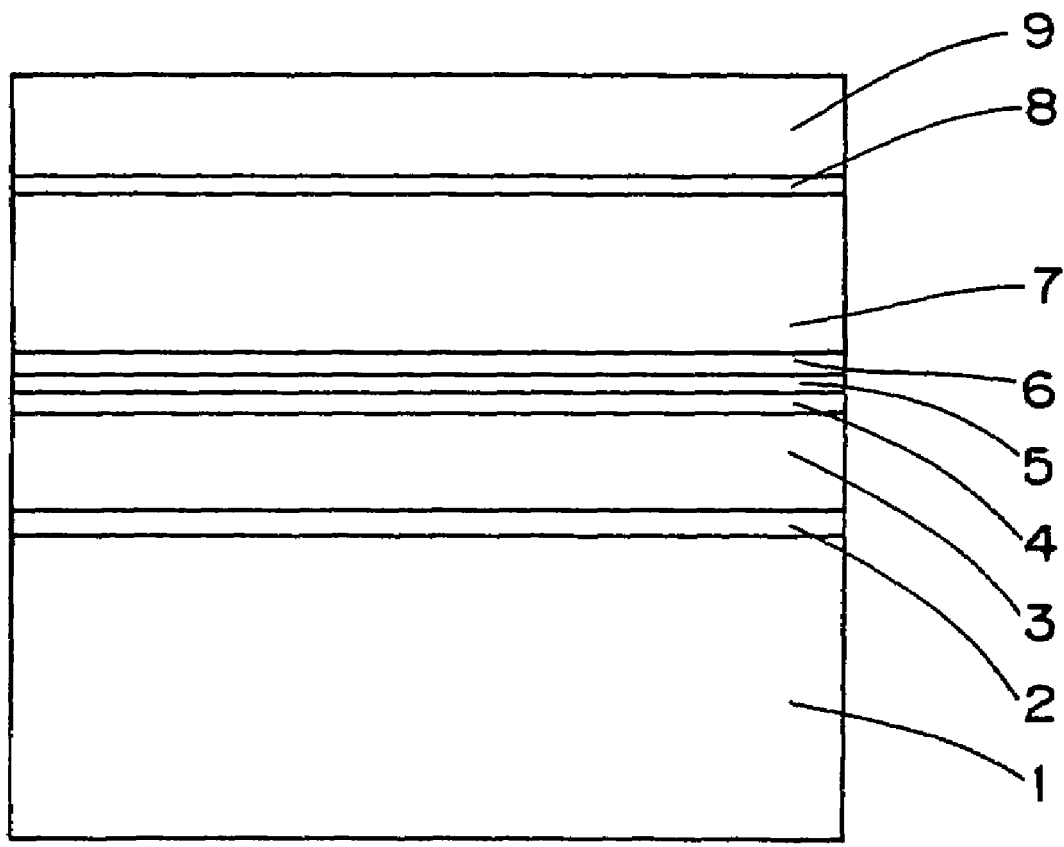
FIG. 3 is a sectional view showing manufacturing process of the semiconductor light-emitting device of the first embodiment.
Figure 4A:
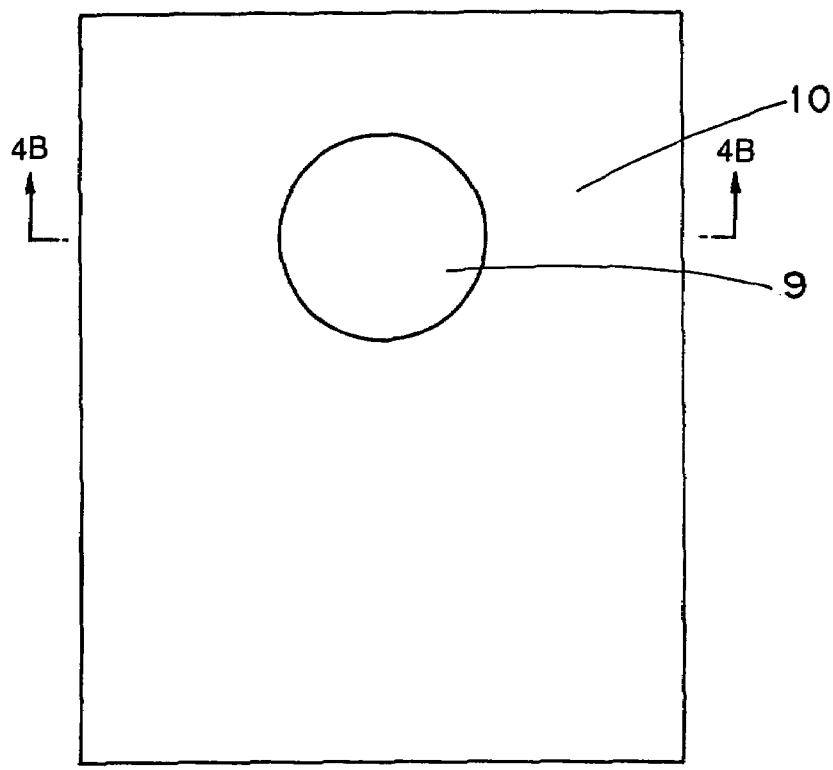
FIGS. 4A and 4B are a plan view and its sectional view taken along the line 4B-4B, respectively, showing manufacturing process of the semiconductor light-emitting device of the first embodiment.
Figure 4B:
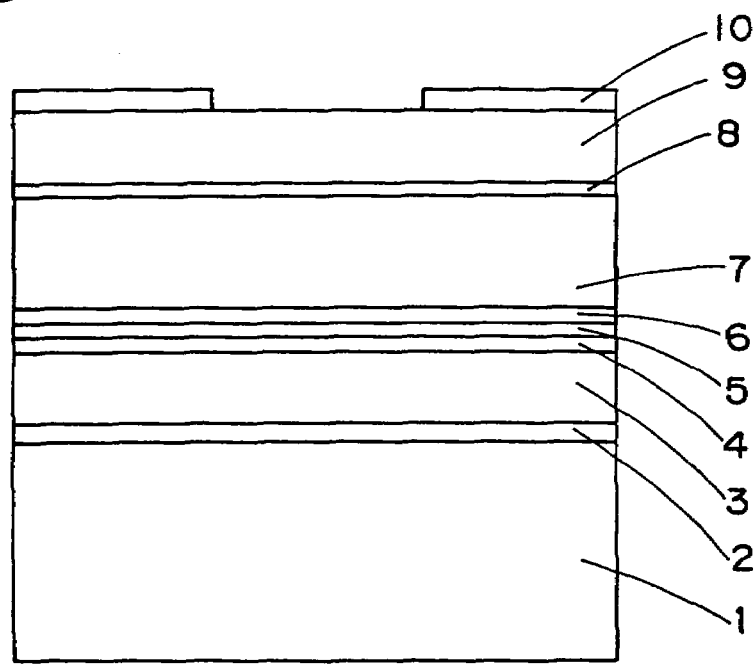

FIG. 3 and FIGS. 4A and 4B show manufacturing process of the semiconductor light-emitting device of FIG. 2, where FIG. 4B is a sectional view taken along the line 4B-4B of FIG. 4A, which is a plan view.

In this semiconductor light-emitting device, as shown in FIG. 3, a 1 μm thick n-type GaAs buffer layer 2, a DBR 3 formed by stacking 20 pairs of layers of n-type $Al_{0.5}In_{0.5}P$ and n-type $(Al_{0.2}Ga_{0.8})_{0.5}I_{0.5}P$ alternately, a first cladding layer 4 made of n-type $Al_{0.5}In_{0.5}P$, a quantum well active layer 5, a second cladding layer 6 made of p-type $Al_{0.5}In_{0.5}P$, a 3 μm thick current diffusion layer 7 made of p-type $Al_{0.5}Ga_{0.5}As$, a 0.1 μm thick etching stopping layer 8 made of p-type $(Al_{0.2}Ga_{0.8})_{0.5}In_{0.5}P$, and a 3 μm thick light scattering layer made of p-type $Al_{0.5}Ga_{0.5}As$ are stacked one by one by MOCVD (Metal Organic Chemical Vapor Deposition) process on an n-type GaAs substrate 1 having a surface whose normal line is inclined by 15° from (100) toward [011].

In this case, the DBR 3 formed of alternately stacked 20 pairs of layers of n-type $Al_{0.5}In_{0.5}P$ and n-type $(Al_{0.2}Ga_{0.8})_{0.5}In_{0.5}P$ is so made that the reflection spectrum is centered at 650 nm. Also, the light-emission peak wavelength of the quantum well active layer 5 is 650 nm as well.

Next, as shown in FIG. 4B, a $SiO_2$ film 10 is formed on the wafer surface by CVD process, and a 70 μm-dia. circular-shaped current path as shown in FIG. 4A is formed by photolithography and etching with dilute HF.

Thereafter, as shown in FIG. 2, AuZn/Mo/Au is sputtered on the p-type $Al_{0.5}Ga_{0.5}As$ light scattering layer 9 and the $SiO_2$ film 10, and a surface electrode is formed by patterning with photolithography and then subjected to heat treatment, by which a p-type electrode 11 is obtained.

Further, on the surface of the p-type $Al_{0.5}Ga_{0.5}As$ light scattering layer 9 within the 70 μm-dia. circular-shaped current path where the p-type electrode 11 is not formed, is formed a 5 μm-pitch grating pattern by photolithography and with a sulfuric acid/hydrogen peroxide based etchant. In doing this, the etching is done up to the p-type $(Al_{0.2}Ga_{0.8})_{0.5}In_{0.5}P$ etching stopping layer 8, by which the depth of the grating pattern is controlled. Finally, the rear surface of the GaAs substrate 1 is abraded to about 280 μm, and AuGe/Au is deposited on this abraded surface and then subjected to heat treatment, by which an n-type electrode 12 is formed.

Figure 5:
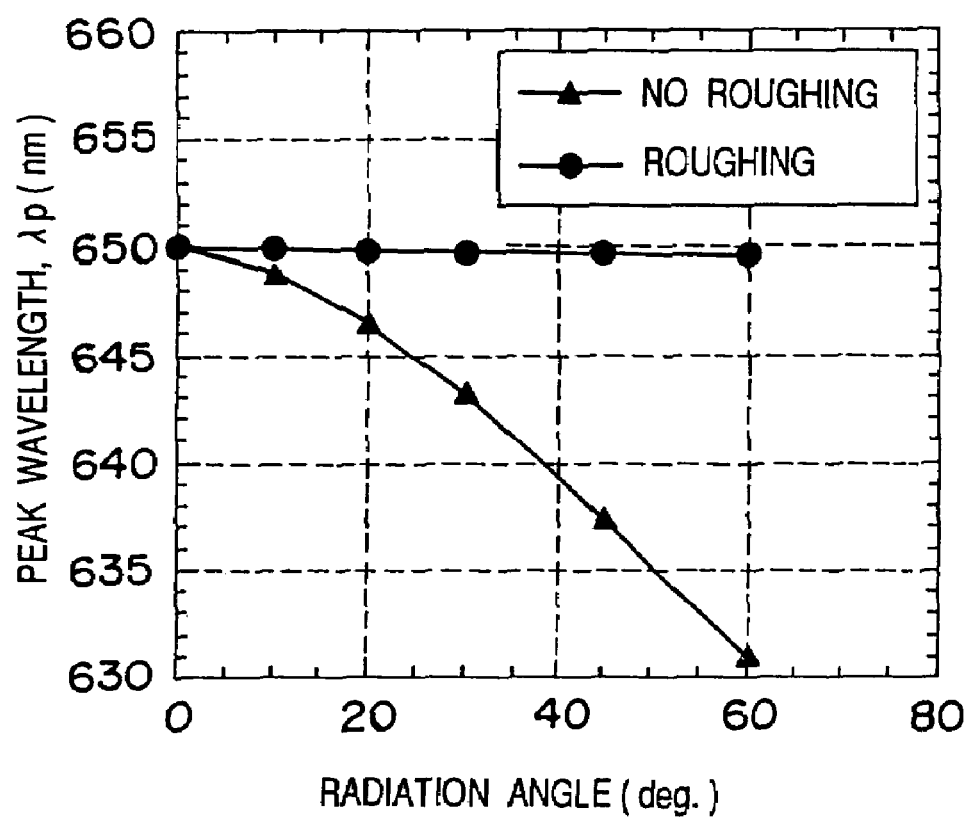
FIG. 5 is a chart showing radiation angle dependence of the peak wavelength of the semiconductor light-emitting device of the first embodiment.

FIG. 5 shows results of measuring light-emission peak wavelength with varied radiation angles on the surface-roughened semiconductor light-emitting device of the first embodiment and a surface-unroughened semiconductor light-emitting device of the prior art. In the semiconductor light-emitting device of the first embodiment, the p-type $Al_{0.5}Ga_{0.5}As$ light scattering layer 9, which is provided with a 5 μm-pitch grating pattern at the surface, is smaller in radiation angle dependence of emission wavelength shown by circle marks, compared with the unroughened semiconductor light-emitting device of the prior art shown by triangle marks in the figure.

The DBR 3, which is a multilayer reflection film, has a total film thickness of about 2 μm. Such a level of thickness does not yield warps of the substrate or occurrences of dark lines due to thermal expansion differences from the GaAs substrate 1. Also, stacking 20 pairs of layers in the DBR 3 allows as high a reflectance as about 90% to be realized.

When this semiconductor light-emitting device was subjected to a 50 mA conduction test at a temperature of 80° C. and a humidity of 85%, the semiconductor light-emitting device showed a 90% optical output after a 1000-hour elapse, compared with the initial one. Also, the semiconductor light-emitting device, which is high in both internal quantum efficiency and external output efficiency because of its current constriction structure, showed as high a value of initial optical output as 1.6 mW at 20 mA.

Embodiment 2

Figure 6A:
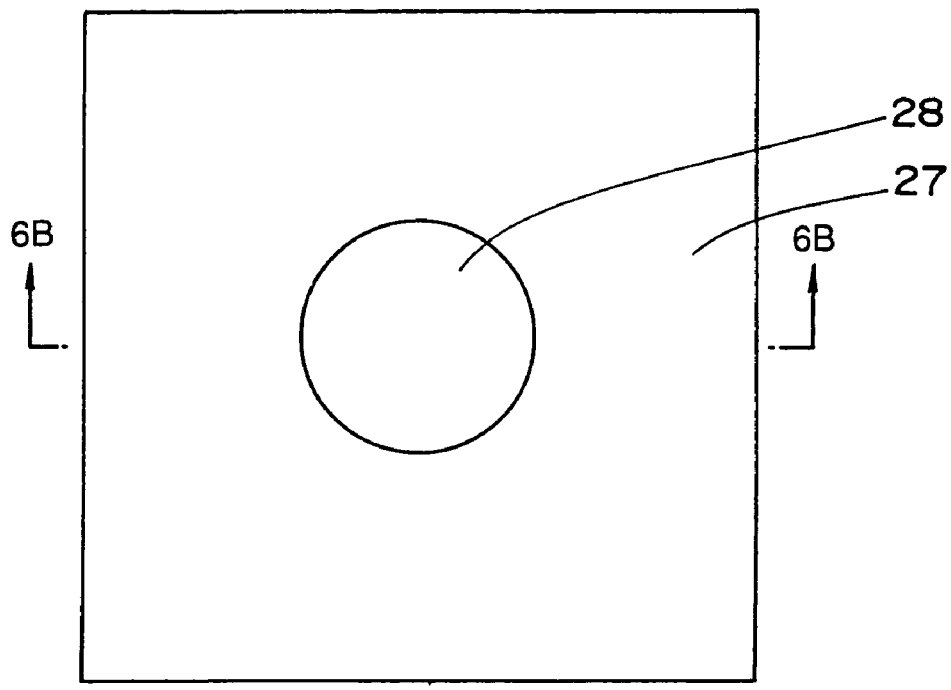
FIGS. 6A and 6B are a plan view and its sectional view taken along the line 6B-6B, respectively, of a semiconductor light-emitting device according to a second embodiment of the invention.
Figure 6B:
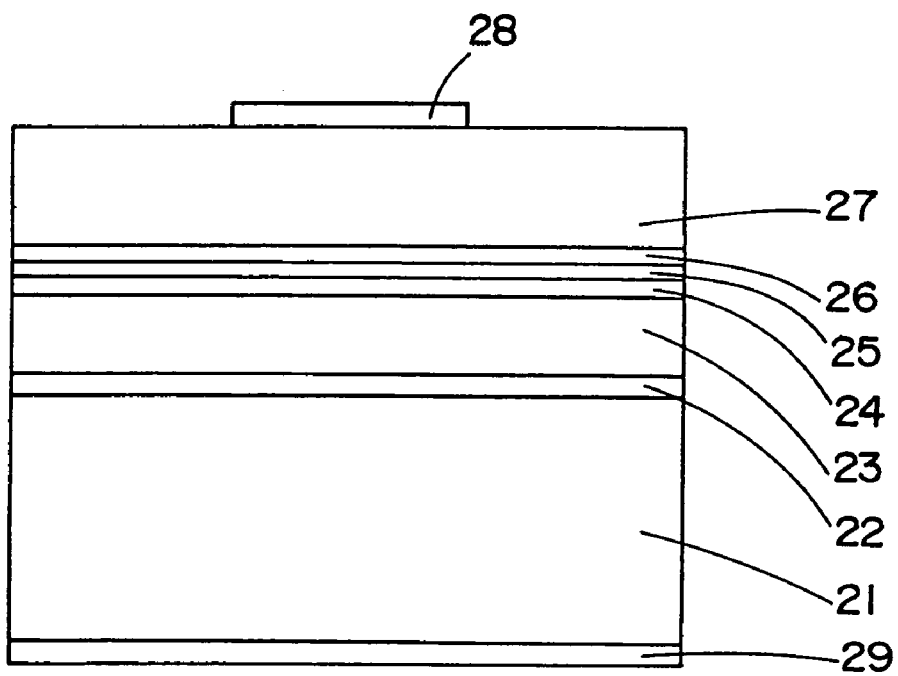

FIGS. 6A and 6B are a plan view and a sectional view taken along the line 6B-6B, respectively, of an AlGaInP based semiconductor light-emitting device which is a second embodiment of the invention. In FIGS. 6A and 6B, reference numeral 21 denotes an n-type GaAs substrate, 22 denotes an n-type GaAs buffer layer, 23 denotes a DBR formed by stacking 30 pairs of layers of n-type AlAs and n-type $Al_{0.5}Ga_{0.5}As$ alternately, 24 denotes a first cladding layer made of n-type $Al_{0.5}In_{0.5}P$, 25 denotes a quantum well active layer formed with $(Al_{0.5}Ga_{0.5})_{0.5}In_{0.5}P$ barrier layers provided between two quantum well layers made of 80 Å thick GaInP and on both sides, 26 denotes a second cladding layer made of p-type $Al_{0.5}In_{0.5}P$, 27 denotes a current diffusion layer made of p-type $Al_{0.5}Ga_{0.5}As$, 28 denotes a p-type electrode, and 29 denotes an n-type electrode of the substrate rear surface.

Figure 7:
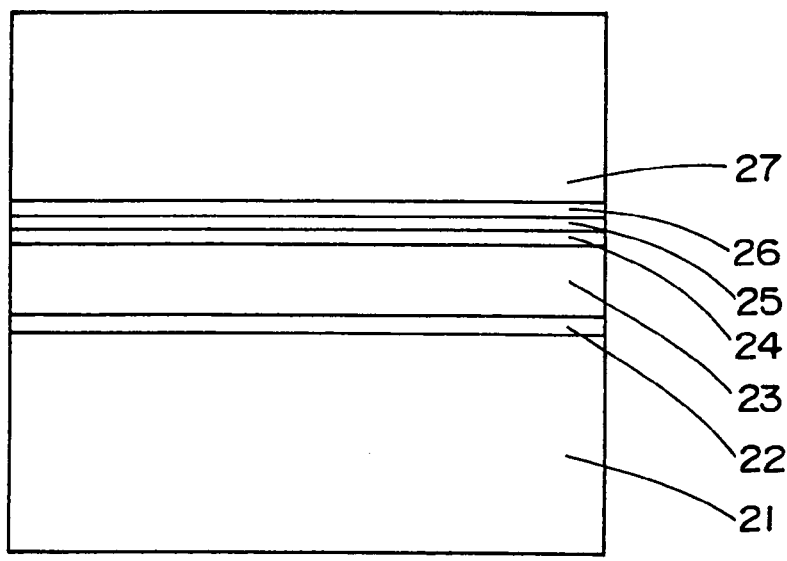
FIG. 7 is a sectional view showing manufacturing process of the semiconductor light-emitting device of the second embodiment.
Figure 8:
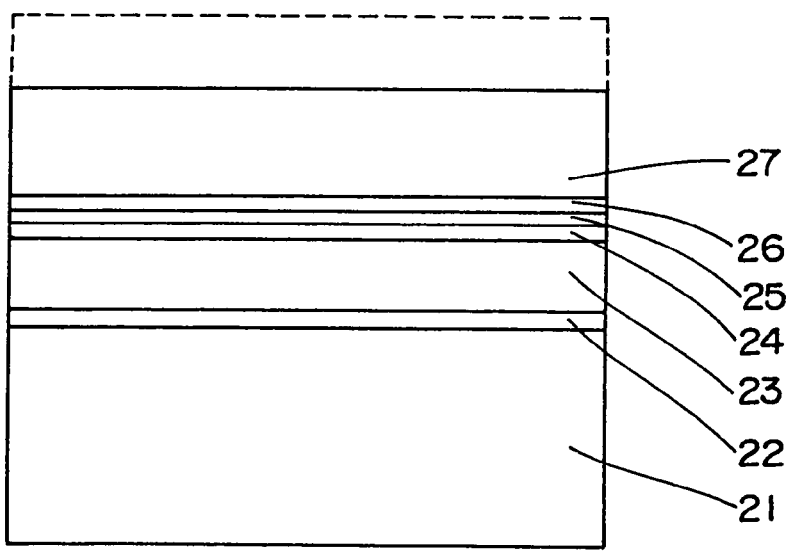
FIG. 8 is a sectional view showing manufacturing process of the semiconductor light-emitting device of the second embodiment.
Figure 9A:
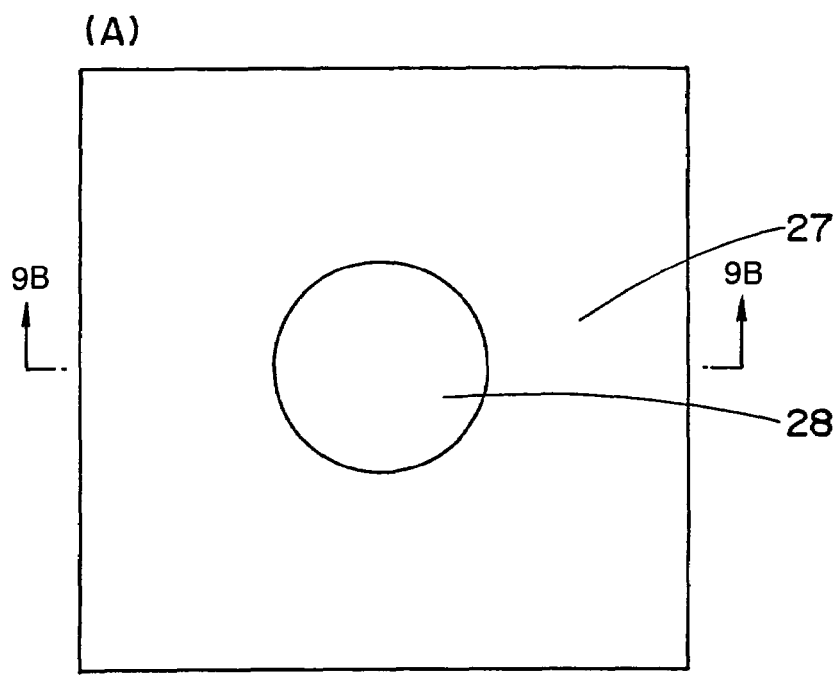
FIGS. 9A and 9B are a plan view and its sectional view taken along the line 9B-9B, respectively, showing manufacturing process of the semiconductor light-emitting device of the second embodiment.
Figure 9B:
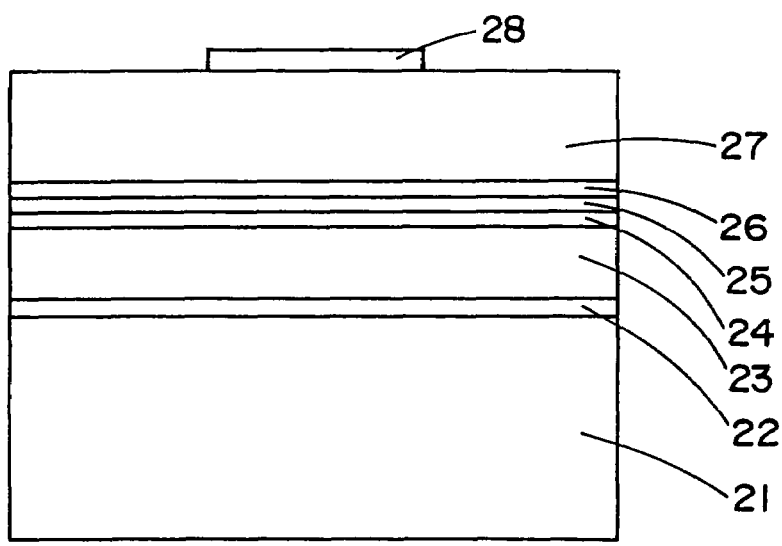

FIG. 7, FIG. 8 and FIGS. 9A and 9B show manufacturing process of the semiconductor light-emitting device of FIG. 6, where FIG. 9B is a sectional view taken along the line 9B-9B of FIG. 9A, which is a plan view.

In this semiconductor light-emitting device, as shown in FIG. 7, a 1 μm thick n-type GaAs buffer layer 22, a DBR 23 formed by stacking 30 pairs of layers of n-type AlAs and n-type $Al_{0.5}Ga_{0.5}As$ alternately, a first cladding layer 24 made of n-type $Al_{0.5}In_{0.5}P$, a quantum well active layer 25, a second cladding layer 26 made of p-type $Al_{0.5}In_{0.5}P$, and a 10 μm thick current diffusion layer 27 made of p-type $Al_{0.5}Ga_{0.5}As$ are stacked one by one by MOCVD process on an n-type GaAs substrate 21 having a surface whose normal line is inclined by 15° from (100) toward [011].

In this case, the DBR 23 formed of alternately stacked 30 pairs of layers of n-type AlAs and n-type $Al_{0.5}Ga_{0.5}As$ is so made that the reflection spectrum is centered at 650 nm. Also, the light-emission peak wavelength of the quantum well active layer 25 is 650 nm as well.

Next, as shown in FIG. 8, the surface of the 10 μm thick current diffusion layer 27 made of p-type $Al_{0.5}Ga_{0.5}As$ is abraded by a few μm into a roughened surface so that outgoing light is scattered.

Further, as shown in FIG. 9B, AuZn/Mo/Au is sputtered on the p-type $Al_{0.5}Ga_{0.5}As$ current diffusion layer 27, and a circular-shaped surface electrode protruding at the center is formed by patterning with photolithography and then subjected to heat treatment, by which a p-type electrode 28 is obtained.

Finally, as shown in FIG. 6B, the rear surface of the GaAs substrate 21 is abraded to about 280 μm, and AuGe/Au is deposited on this abraded surface and then subjected to heat treatment, by which an n-type electrode 29 is formed.

In the semiconductor light-emitting device of the second embodiment obtained in this way, in which the wafer surface is roughened by abrasion, the complex photolithography step, which has been necessary for the roughing in the first embodiment, becomes unnecessary, so that the process can be simplified. The radiation angle dependence of emission wavelength of this semiconductor light-emitting device is small enough, as has been described with the first embodiment in FIG. 5. Also, since the DBR 23, which is a multilayer reflection film, is formed of alternately stacked 30 pairs of layers of n-type AlAs and n-type $Al_{0.5}Ga_{0.5}As$, a reflectance of 99% can be realized. Since the DBR 3 of the first embodiment is made of AlGaInP based material, largely differing in coefficient of thermal expansion from the substrate 1 made of GaAs, stacking 30 pairs of layers would make dislocation in crystals more likely to occur, leading to such defaults as dark lines and substrate warps. On the other hand, the DBR 23 of the second embodiment is made of AlGaAs based material, which has a coefficient of thermal expansion close to that of the GaAs substrate 21, thus free from occurrence of such problems as dark lines and substrate warps.

Also with the semiconductor light-emitting device of the second embodiment, when a 50 mA conduction test was performed at a temperature of 80° C. and a humidity of 85% as in the first embodiment, a result of a 90% optical output after a 1000-hour elapse, compared with the initial one, was obtained. Also, the semiconductor light-emitting device showed an initial optical output of 1.0 mW at 20 mA, which can be said an enough high value, taking into consideration that the second embodiment is not of a current constriction structure so that the light takeout efficiency lowers by about 40%, compared with the first embodiment.

Embodiment 3

Figure 10A:
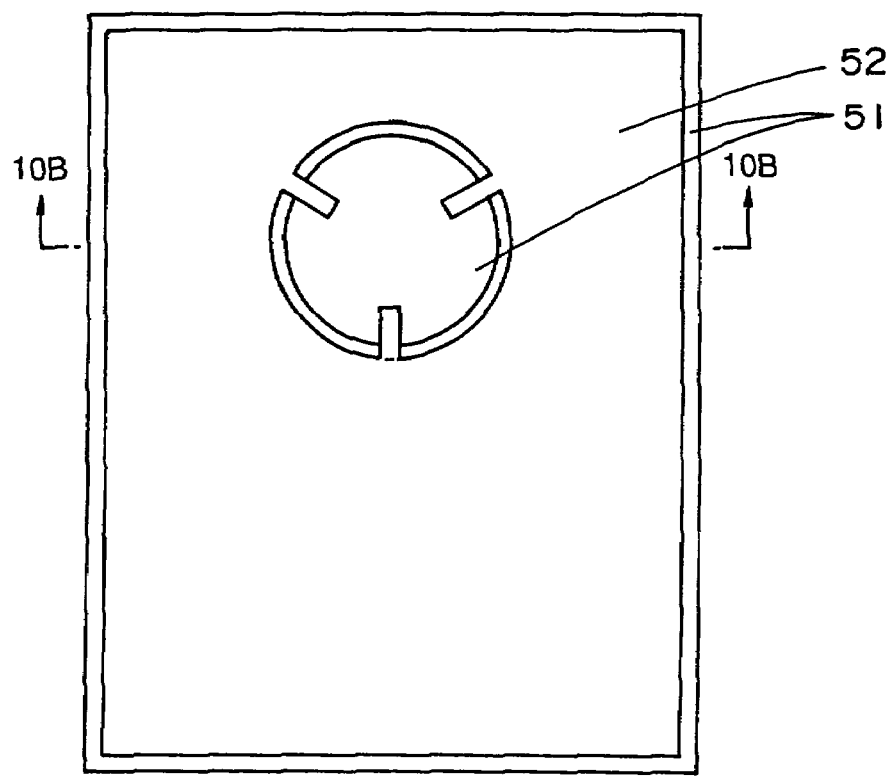
FIGS. 10A and 10B a plan view and its sectional view taken along the line 10B-10B, respectively, of a semiconductor light-emitting device according to a third embodiment of the invention.
Figure 10B:
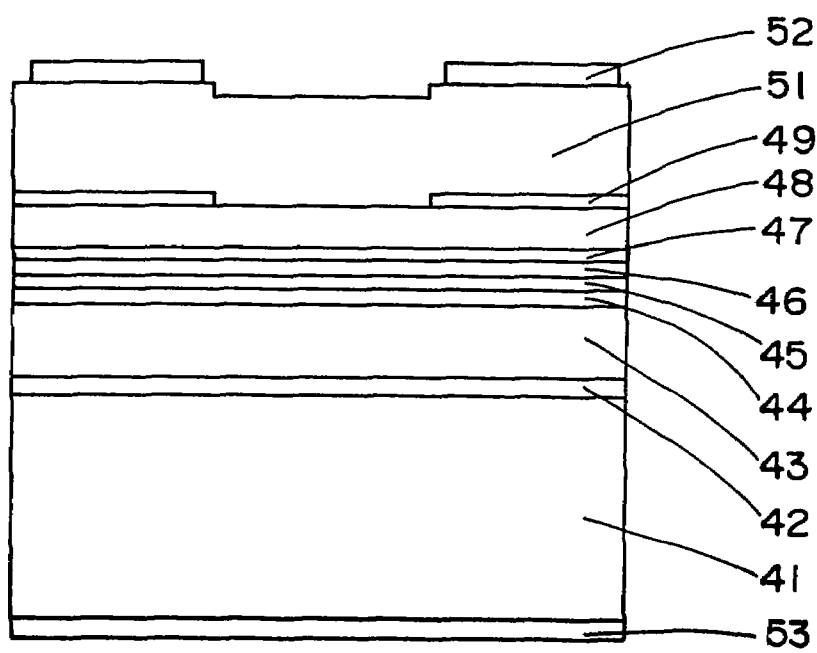

FIGS. 10A and 10B are a plan view and a sectional view taken along the line 10B-10B, respectively, of an AlGaInP based semiconductor light-emitting device which is a third embodiment of the invention. In FIGS. 10A and 10B, reference numeral 41 denotes an n-type GaAs substrate, 42 denotes an n-type GaAs buffer layer, 43 denotes a DBR formed by stacking 70 pairs of layers of n-type AlAs and n-type $Al_{0.7}Ga_{0.3}As$ alternately, 44 denotes a first cladding layer made of n-type $Al_{0.5}In_{0.5}P$, 45 denotes a quantum well active layer formed with $(Al_{0.5}Ga_{0.5})_{0.5}In_{0.5}P$ barrier layers provided between four quantum well layers made of 80 Å thick $(Al_{0.3}Ga_{0.7})_{0.5}In_{0.5}P$ and on both sides, 46 denotes a second cladding layer made of p-type $Al_{0.5}In_{0.5}P$, 47 denotes an intermediate layer made of p-type AlGaInP, 48 denotes a first current diffusion layer made of p-type AlGaInP, 49 denotes a current constriction layer made of n-type AlGaInP, 51 denotes a second current diffusion layer made of p-type AlGaInP, 52 denotes a p-type electrode, and 53 denotes an n-type electrode of the substrate rear surface.

Figure 11:
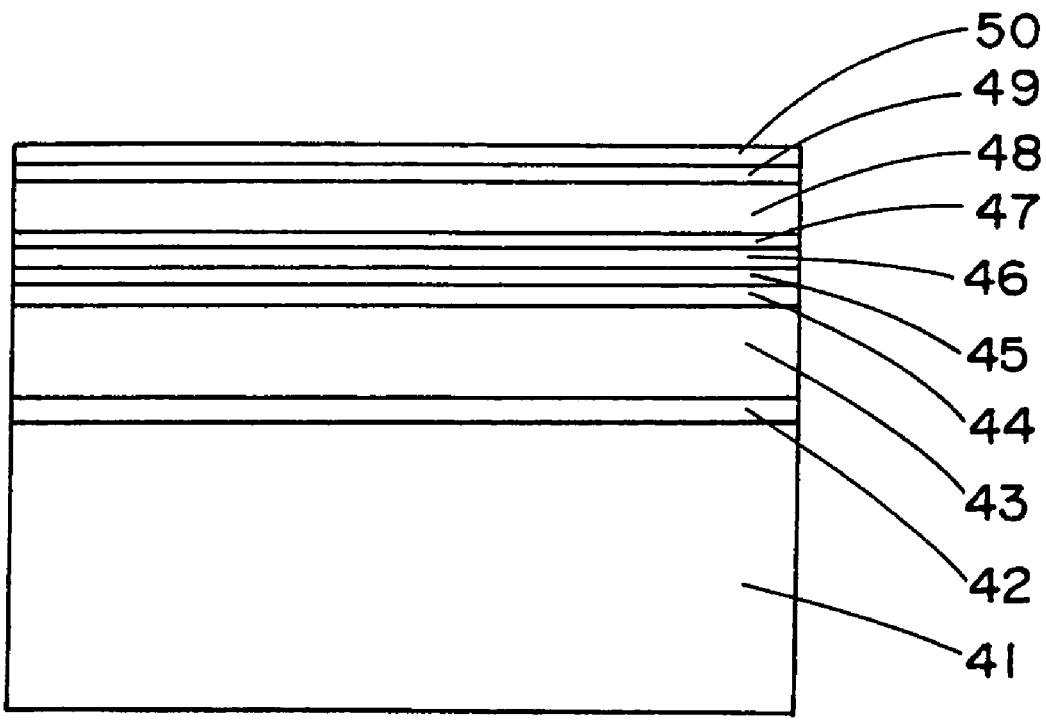
FIG. 11 is a sectional view showing manufacturing process of a semiconductor light-emitting device according to a third embodiment.
Figure 12A:
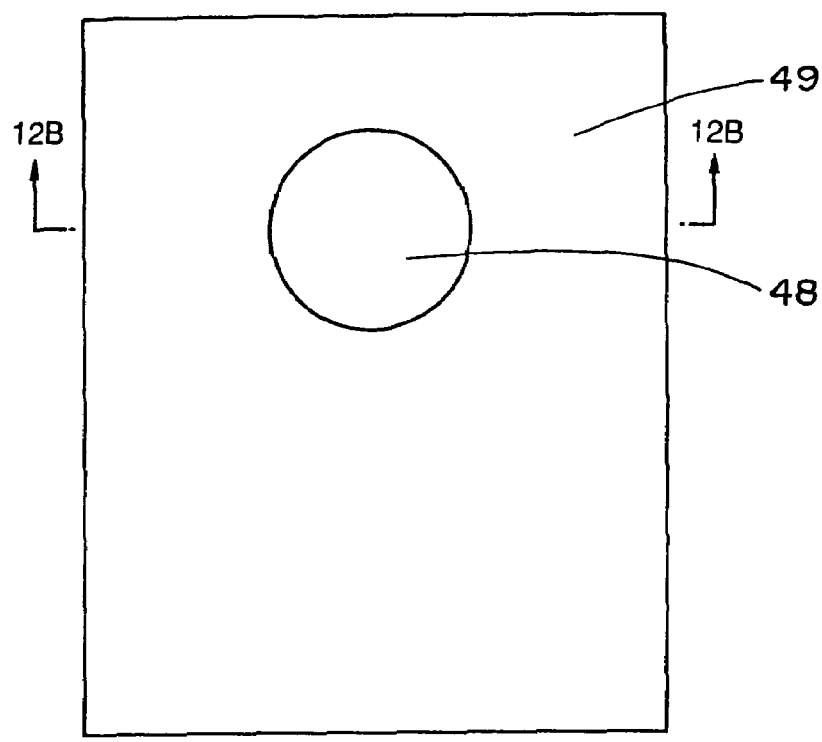
FIGS. 12A and 12B are a plan view and its sectional view taken along the line 12B-12B, respectively, showing manufacturing process of the semiconductor light-emitting device of the third embodiment.
Figure 12B:
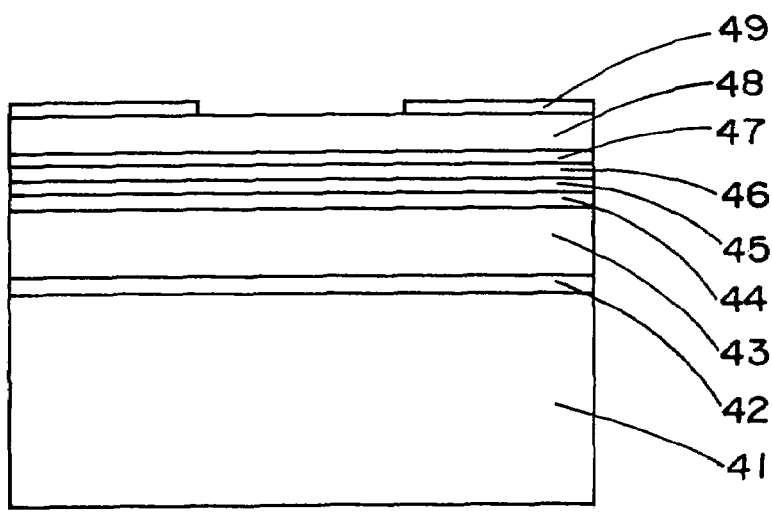
Figure 13A:
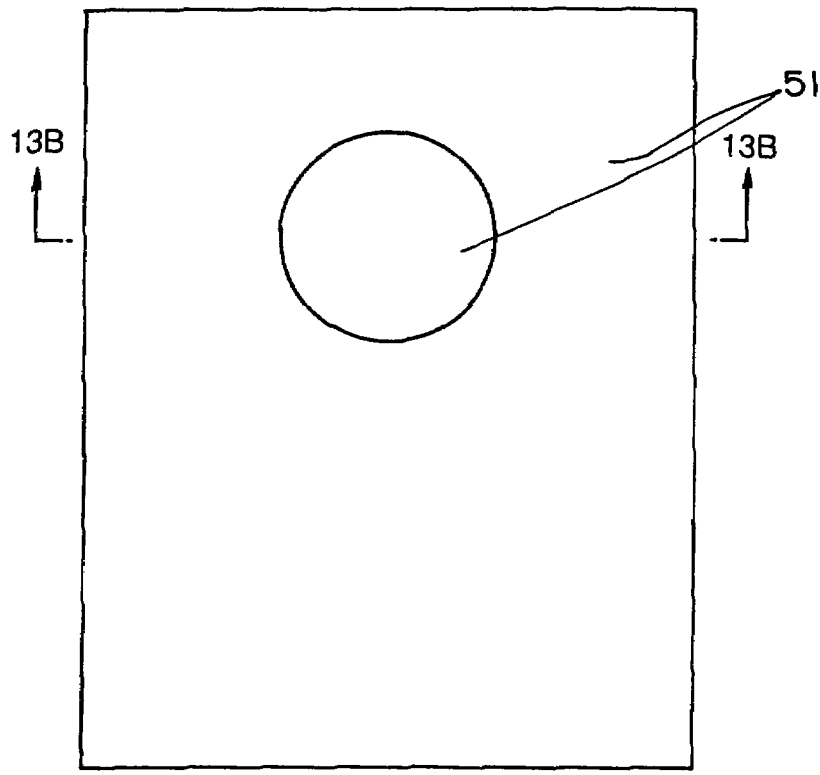
FIGS. 13A and 13B are a plan view and its sectional view taken along the line 13B-13B, respectively, showing manufacturing process of the semiconductor light-emitting device of the third embodiment.
Figure 13B:
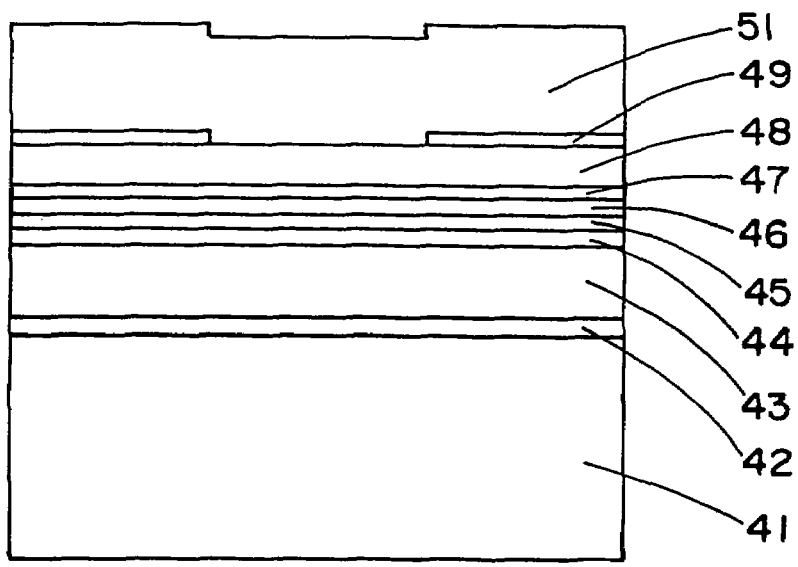

FIG. 11, FIGS. 12A and 12B, and FIGS. 13A and 13B show manufacturing process of the semiconductor light-emitting device of FIG. 10, where FIGS. 12B and 13B are sectional views taken along the lines 12B-12B and 13B-13B of FIGS. 12A and 13A, respectively, which are plan views.

In this semiconductor light-emitting device, as shown in FIG. 11, a 1 µm thick n-type GaAs buffer layer 42, a DBR 43 formed by stacking 70 pairs of layers of n-type AlAs and n-type $Al_{0.7}Ga_{0.3}As$ alternately, a first cladding layer 44 made of n-type $Al_{0.5}In_{0.5}P$, a quantum well active layer 45, a second cladding layer 46 made of p-type $Al_{0.5}In_{0.5}P$, a 0.15 µm thick intermediate layer 47 made of p-type AlGaInP, a 1 µm thick first current diffusion layer 48 made of p-type AlGaInP, a 0.3 µm thick current constriction layer 49 made of n-type AlGaInP, and a 0.01 µm thick cap layer 50 made of n-type GaAs are stacked one by one by MOCVD process on an n-type GaAs substrate 41 having a surface whose normal line is inclined by 15° from (100) toward [011].

In this case, the DBR 43 formed of alternately stacked 70 pairs of layers of n-type AlAs and n-type $Al_{0.7}Ga_{0.3}As$ is so made that the reflection spectrum is centered at 570 nm. Also, the light-emission peak wavelength of the quantum well active layer 45 is 570 nm as well.

Next, the n-type GaAs cap layer 50 is removed with a sulfuric acid/hydrogen peroxide based etchant. Thereafter, as shown in FIGS. 12A and 12B, the current constriction layer 49 of n-type AlGaInP is etched up to the first current diffusion layer 48 of p-type AlGaInP by photolithography and with a sulfuric acid/hydrogen peroxide based etchant, by which a 70 µm-dia. circular-shaped current path is formed.

After that, as shown in FIG. 13, a 7 µm thick second current diffusion layer 51 of p-type AlGaInP is regrown on the current constriction layer 49 of n-type AlGaInP and the first current diffusion layer 48 of p-type AlGaInP.

Further, as shown in FIG. 10B, AuBe/Au is deposited on the second current diffusion layer 51 of p-type AlGaInP, and a surface electrode as shown FIG. 10A is formed by photolithography and by etching with a Au etchant and then subjected to heat treatment, by which a p-type electrode 52 is obtained.

Subsequently, the wafer is boiled in 65-70° C. hydrochloric acid, by which surface portion of the p-type AlGaInP second current diffusion layer 51 which is not covered with the p-type electrode 52 is roughened. Finally, the rear surface of the GaAs substrate 41 is abraded to about 280 µm, and AuGe/Au is deposited on this abraded surface and then subjected to heat treatment, by which an n-type electrode 53 is formed.

In the semiconductor light-emitting device of the third embodiment obtained in this way, in which the surface is roughened by boiling the wafer in hydrochloric acid, the steps of sticking a wafer or sheet to another wafer or the like, abrasion and thereafter taking out and cleaning the wafer or sheet, which have been necessary in the second embodiment, become unnecessary, so that the process can be simplified. The radiation angle dependence of emission wavelength of this semiconductor light-emitting device is small enough, as in the foregoing first and second embodiments. Also, since the DBR 43 is formed of stacked 70 pairs of layers, a reflectance of 99% can be realized. Since the DBR 43 of the third embodiment is made of AlGaAs based material, which has a coefficient of thermal expansion close to that of the GaAs substrate 41, thus free from occurrence of such problems as dark lines and substrate warps even if the DBR 43 has a total thickness of about 7 µm, further thicker than the first embodiment.

Also with the semiconductor light-emitting device of the third embodiment, when a 50 mA conduction test was performed at a temperature of 80° C. and a humidity of 85% as in the first and second embodiments, a result of a 105% optical output after a 1000-hour elapse, compared with the initial one, was obtained. Also, as can be understood from a comparison between FIG. 10A and FIG. 2A, since the branched electrode on the light emitting part is reduced in area so as to be smaller than that of the first embodiment, the semiconductor light-emitting device showed an initial optical output of 0.4 mW, which is high enough for a light-emitting diode having an emission wavelength of 570 nm and which is an about 10% improvement in light takeout efficiency.

Embodiment 4

Figure 14A:
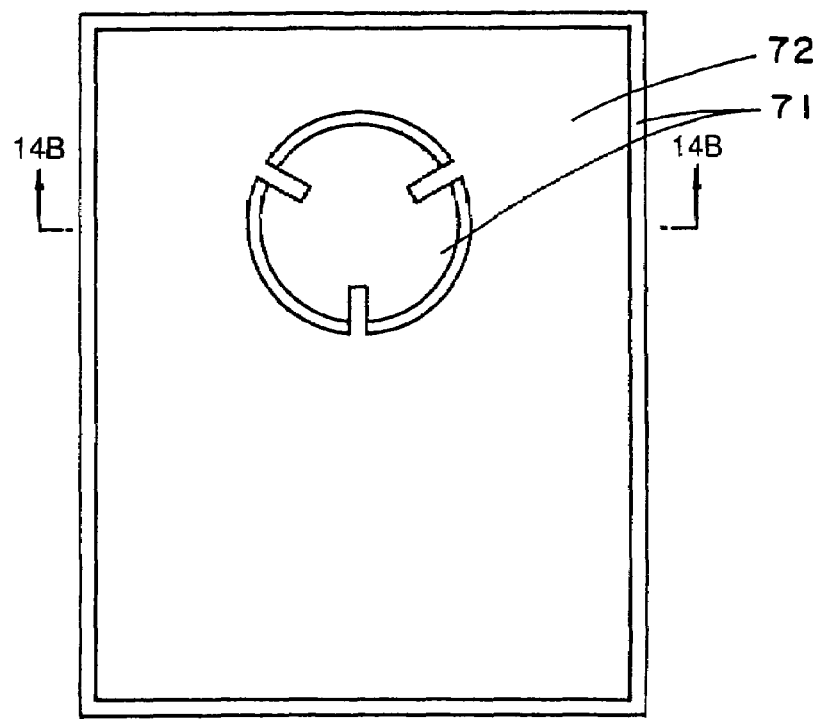
FIGS. 14A and 14B are a plan view and its sectional view taken along the line 14B-14B, respectively, of a semiconductor light-emitting device according to a fourth embodiment of the invention.
Figure 14B:
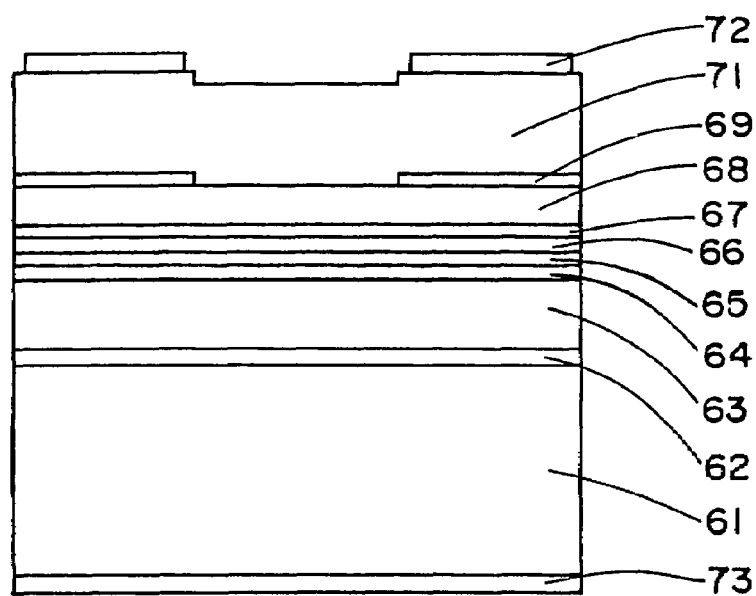

FIGS. 14A and 14B are a plan view and a sectional view taken along the line 14B-14B, respectively, of an AlGaInP based semiconductor light-emitting device which is a fourth embodiment of the invention. In FIGS. 14A and 14B, reference numeral 61 denotes an n-type GaAs substrate, 62 denotes an n-type GaAs buffer layer, 63 denotes a DBR formed by stacking 30 pairs of layers of n-type AlAs and n-type $Al_{0.5}Ga_{0.5}As$ alternately, 64 denotes a first cladding layer made of n-type $Al_{0.5}In_{0.5}P$, 65 denotes a quantum well active layer formed with a 80 Å thick GaInP well layer sandwiched by $(Al_{0.5}Ga_{0.5})_{0.5}In_{0.5}P$ barrier layers, 66 denotes a second cladding layer made of p-type $Al_{0.5}In_{0.5}P$, 67 denotes an intermediate layer made of p-type AlGaInP, 68 denotes a first current diffusion layer made of p-type AlGaInP, 69 denotes a current constriction layer made of n-type AlGaInP, 71 denotes a second current diffusion layer made of p-type AlGaInP, 72 denotes a p-type electrode, and 73 denotes an n-type electrode of the substrate rear surface.

Figure 15:
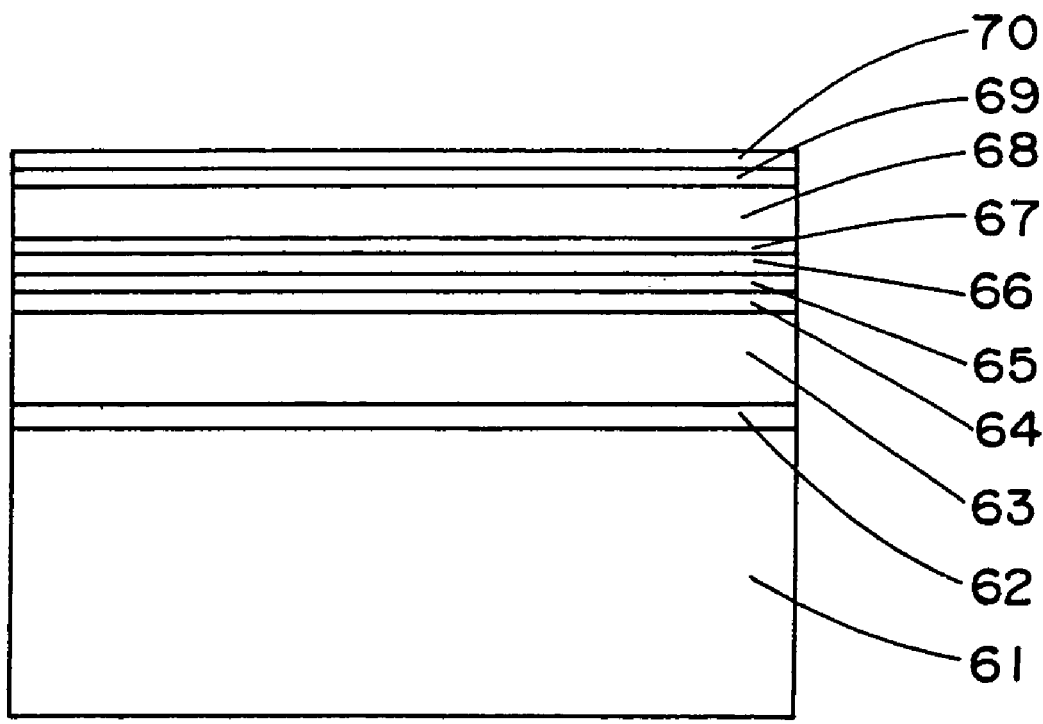
FIG. 15 is a sectional view showing manufacturing process of the semiconductor light-emitting device of the fourth embodiment.
Figure 16A:
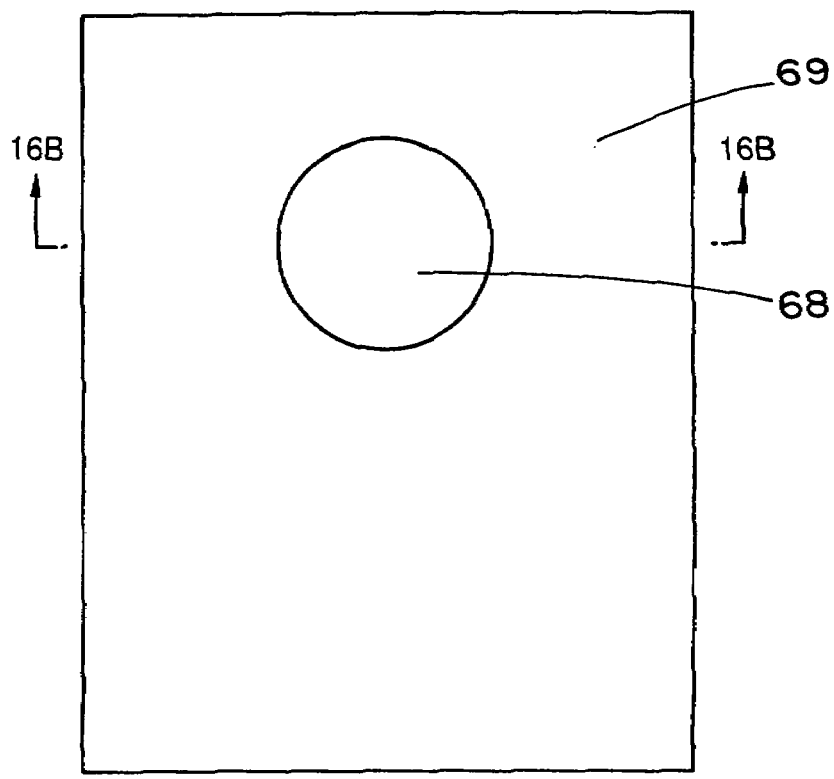
FIGS. 16A and 16B are a plan view and its sectional view taken along the line 16B-16B, respectively, showing manufacturing process of the semiconductor light-emitting device of the fourth embodiment.
Figure 16B:
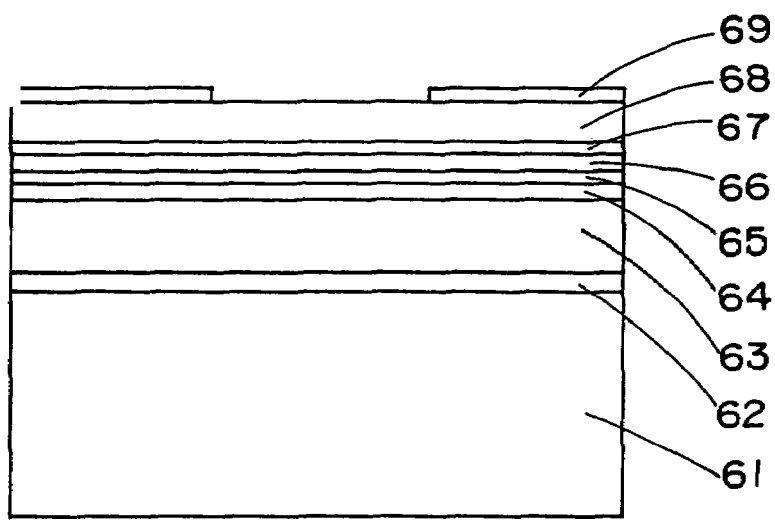
Figure 17A:
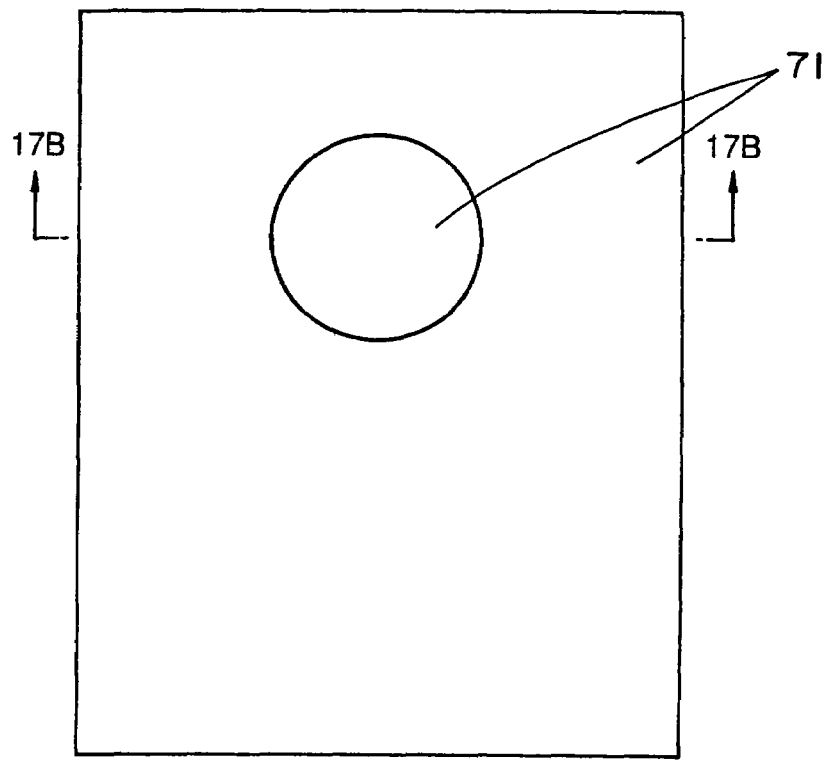
FIGS. 17A and 17B are a plan view and its sectional view taken along the line 17B-17B, respectively, showing manufacturing process of the semiconductor light-emitting device of the fourth embodiment.
Figure 17B:
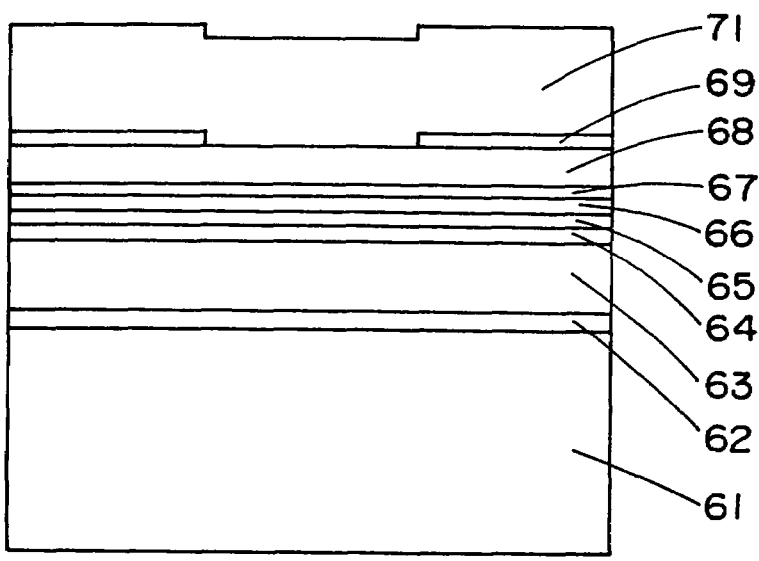

FIG. 15, FIGS. 16A and 16B, and FIGS. 17A and 17B show manufacturing process of the semiconductor light-emitting device of FIG. 14, where FIGS. 16B and 17B are sectional views taken along the lines 16B-16B and 17B-17B of FIGS. 16A and 17A, respectively, which are plan views.

In this semiconductor light-emitting device, as shown in FIG. 15, a 1 μm thick n-type GaAs buffer layer 62, a DBR 63 formed by stacking 30 pairs of layers of n-type AlAs and n-type $Al_{0.5}Ga_{0.5}As$ alternately, a first cladding layer 64 made of n-type $Al_{0.5}In_{0.5}P$, a quantum well active layer 65, a second cladding layer 66 made of p-type $Al_{0.5}In_{0.5}P$, a 0.15 μm thick intermediate layer 67 made of p-type AlGaInP, a 1 μm thick first current diffusion layer 68 made of p-type $Al_{0.01}Ga_{0.98}In_{0.01}P$, a 0.3 μm thick current constriction layer 69 made of n-type $Al_{0.01}Ga_{0.98}In_{0.01}P$, and a 0.01 μm thick cap layer 70 made of n-type GaAs are stacked one by one by MOCVD process on an n-type GaAs substrate 61 having a surface whose normal line is inclined by 15° from (100) toward [011].

In this case, the DBR 63 formed of alternately stacked 30 pairs of layers of n-type AlAs and n-type $Al_{0.5}Ga_{0.5}As$ is so made that the reflection spectrum is centered at 650 nm. Also, the light-emission peak wavelength of the quantum well active layer 65 is 650 nm as well.

Next, the n-type GaAs cap layer 70 is removed with a sulfuric acid/hydrogen peroxide based etchant. Thereafter, as shown in FIGS. 16A and 16B, the current constriction layer 69 of n-type $Al_{0.01}Ga_{0.98}In_{0.01}P$ is etched up to the first current diffusion layer 68 of p-type $Al_{0.01}Ga_{0.98}In_{0.01}P$ by photolithography and with a sulfuric acid/hydrogen peroxide based etchant, by which a 70 μm-dia. circular-shaped current path is formed.

After that, as shown in FIG. 17B, a 7 μm thick second current diffusion layer 71 of p-type $Al_{0.01}Ga_{0.98}In_{0.01}P$ is re-grown on the current constriction layer 69 of n-type $Al_{0.01}Ga_{0.98}In_{0.01}P$ and the first current diffusion layer 68 of p-type $Al_{0.01}Ga_{0.98}In_{0.01}P$. At this stage, since the $Al_{0.01}Ga_{0.98}In_{0.01}P$ layers 68, 69 and 71 having a lattice constant about 3.6% smaller than that of the GaAs substrate 61 have been formed to a total thickness of about 8 μm on the p-type AlGaInP intermediate layer 67, the wafer surface, i.e., the surface of the second current diffusion layer 71 of p-type $Al_{0.01}Ga_{0.98}In_{0.01}P$ becomes a roughened surface depending on the difference in lattice constant.

Further, as shown in FIG. 14B, AuBe/Au is deposited on the second current diffusion layer 71 of p-type $Al_{0.01}Ga_{0.98}In_{0.01}P$, and a surface electrode as shown FIG. 14A is formed by photolithography and by etching with a Au etchant and then subjected to heat treatment, by which a p-type electrode 72 is obtained.

Finally, the rear surface of the GaAs substrate 61 is abraded to about 280 μm, and AuGe/Au is deposited on this abraded surface and then subjected to heat treatment, by which an n-type electrode 73 is formed.

In the semiconductor light-emitting device of the fourth embodiment obtained in this way, the three semiconductor layers 68, 69 and 71 including $Al_yGa_zIn_{1-y-z}P$ ($0 \leq y \leq 1$, $0 \leq z \leq 1$) layers that are different in lattice constant by 0.5% or more from the GaAs substrate 61 are formed above the quantum well active layer 65, which is the light-emitting layer, and the surface is roughened. Therefore, the separate step of roughing the wafer surface after the crystal growth, which has been necessary in the first to third embodiments, becomes unnecessary, so that the process can be simplified.

Also with the semiconductor light-emitting device of the fourth embodiment, as in the first to third embodiments, when a 50 mA conduction test was performed at a temperature of 80° C. and a humidity of 85%, a result of a 90% optical output after a 1000-hour elapse, compared with the initial one, was obtained. Also, the semiconductor light-emitting device showed an initial optical output of 1.7 mW, which is enough high value at 20 mA.

Figure 18:
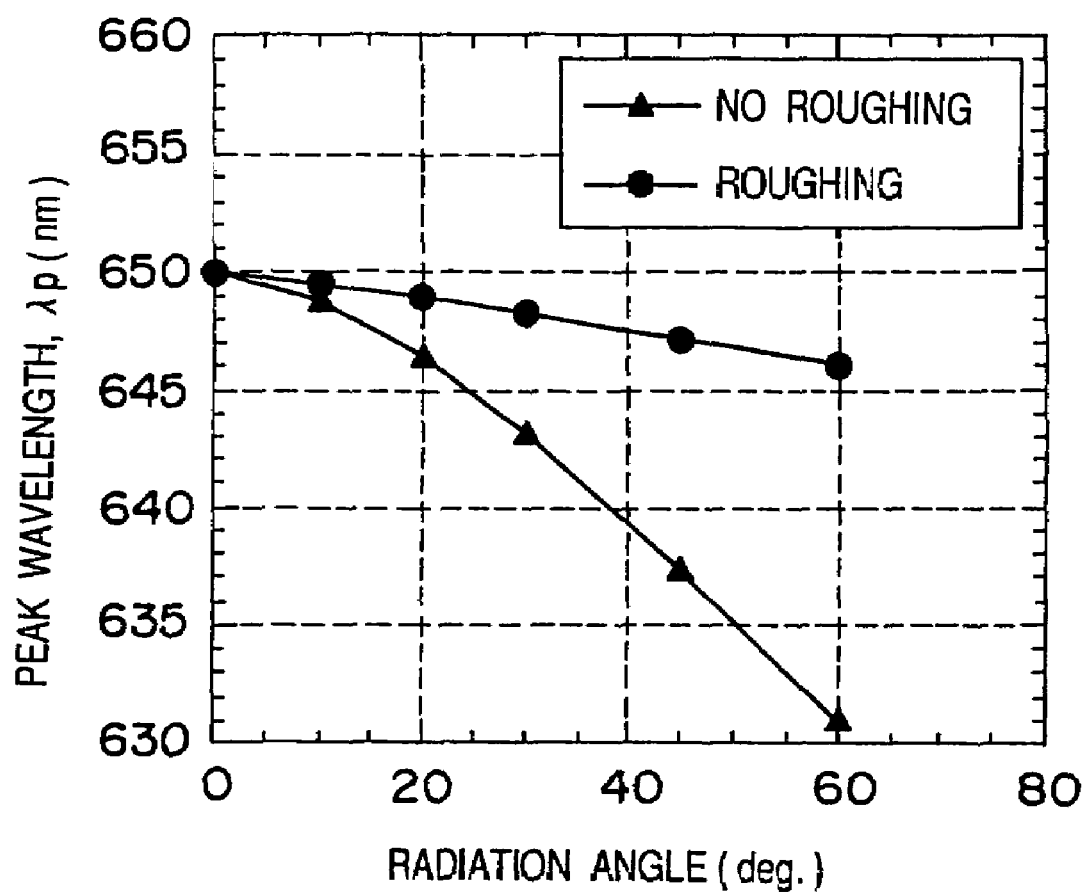
FIG. 18 is a view showing radiation angle dependence of the peak wavelength of the semiconductor light-emitting device of the fourth embodiment.

FIG. 18 shows measurement results of the radiation angle dependence of light-emission peak wavelength with respect to the semiconductor light-emitting device of the fourth embodiment, being a chart similar to FIG. 5. In the semiconductor light-emitting device of the fourth embodiment, since the level of roughing of the wafer surface depending on the lattice constant difference is smaller than those of the other embodiments, the radiation angle dependence of emission wavelength, although remarkably better as shown by circular marks in the chart than without roughing shown by triangular marks in the chart, is slightly sloped and larger than in the other embodiments.

Embodiment 5

Figure 19A:
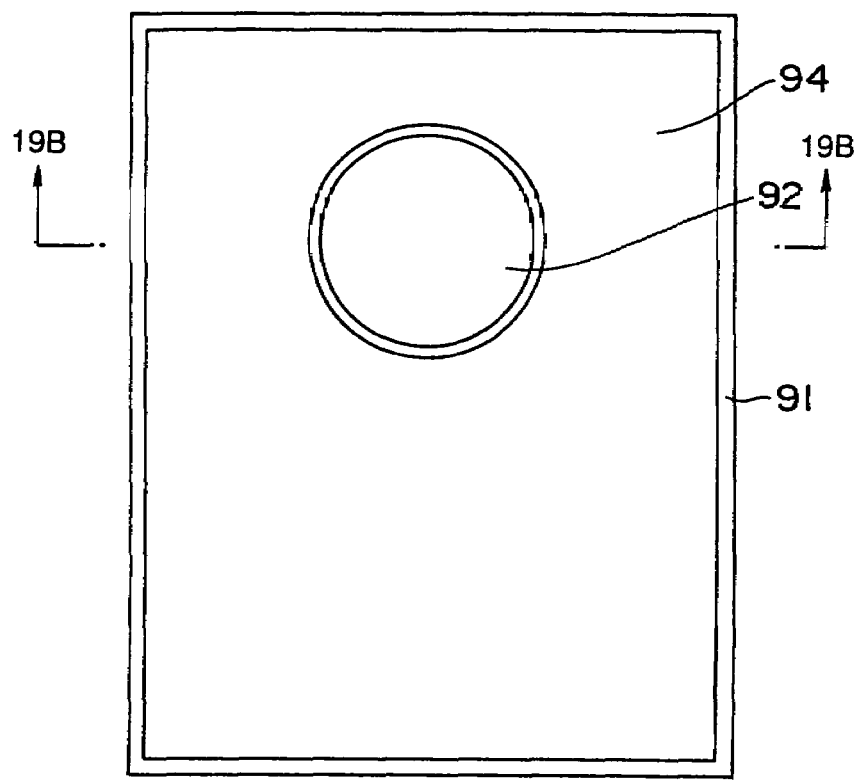
FIGS. 19A and 19B are a plan view and its sectional view taken along the line 19B-19B, respectively, of a semiconductor light-emitting device according to a fifth embodiment of the invention.
Figure 19B:
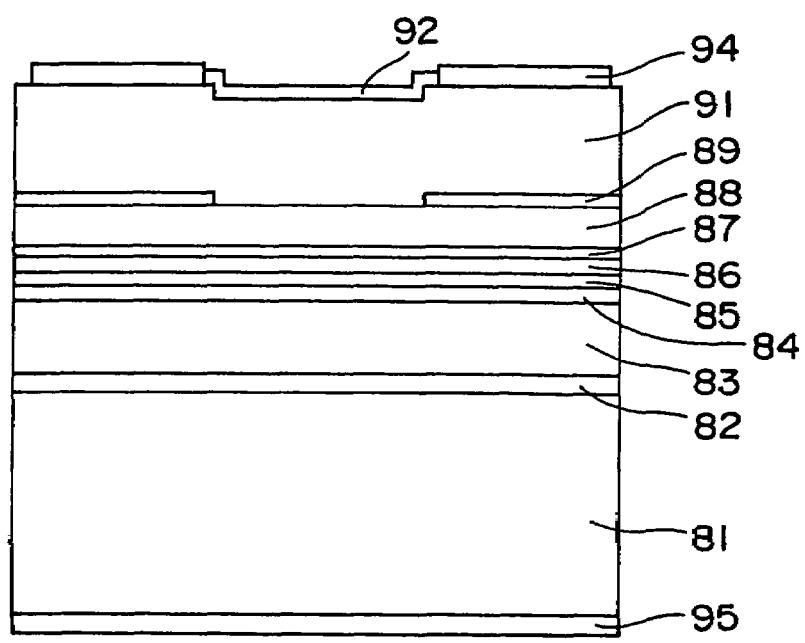

FIGS. 19A and 19B are a plan view and a sectional view taken along the line 19B-19B, respectively, of an AlGaInP based semiconductor light-emitting device which is a fifth embodiment of the invention. In FIGS. 19A and 19B, reference numeral 81 denotes an n-type GaAs substrate, 82 denotes an n-type GaAs buffer layer, 83 denotes a DBR formed by stacking 30 pairs of layers of n-type AlAs and n-type $Al_{0.5}Ga_{0.5}As$ alternately, 84 denotes a first cladding layer made of n-type $Al_{0.5}In_{0.5}P$, 85 denotes a quantum well active layer formed with $(Al_{0.5}Ga_{0.5})_{0.5}In_{0.5}P$ barrier layers provided between two well layers made of 80 Å thick GaInP and on both sides, 86 denotes a second cladding layer made of p-type $Al_{0.5}In_{0.5}P$, 87 denotes an intermediate layer made of p-type AlGaInP, 88 denotes a first current diffusion layer made of p-type AlGaInP, 89 denotes a current constriction layer made of n-type AlGaInP, 91 denotes a second current diffusion layer made of p-type AlGaInP, 92 denotes a light scattering layer made of $Al_{0.6}Ga_{0.4}As$, 94 denotes a p-type electrode, and 95 denotes an n-type electrode.

Figure 20:
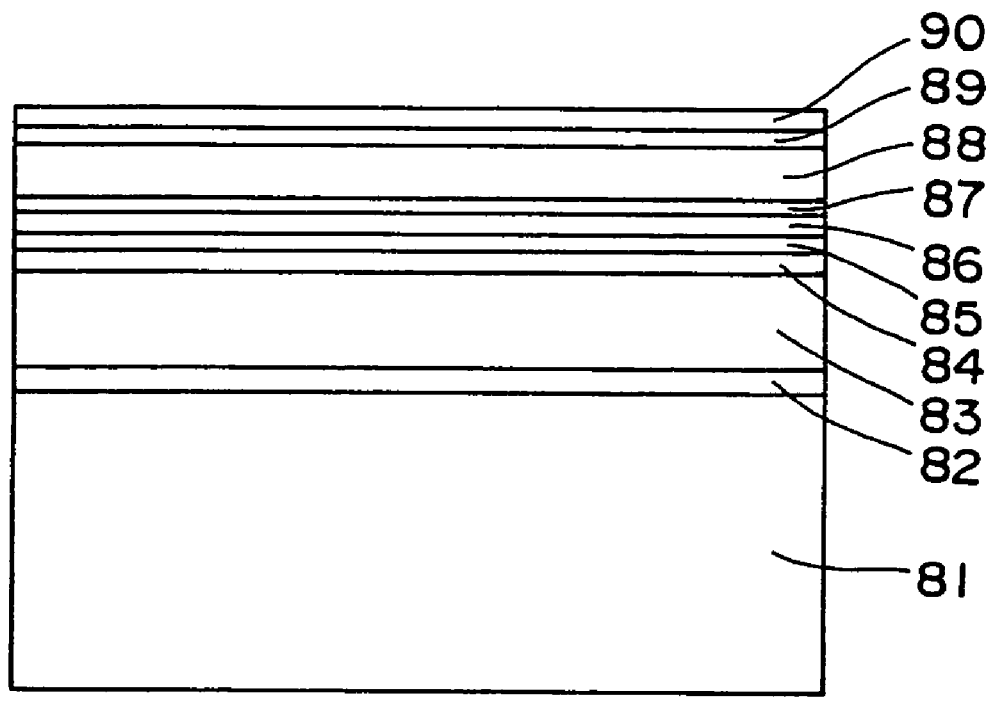
FIG. 20 is a sectional view showing manufacturing process of the semiconductor light-emitting device of the fifth embodiment.
Figure 21A:
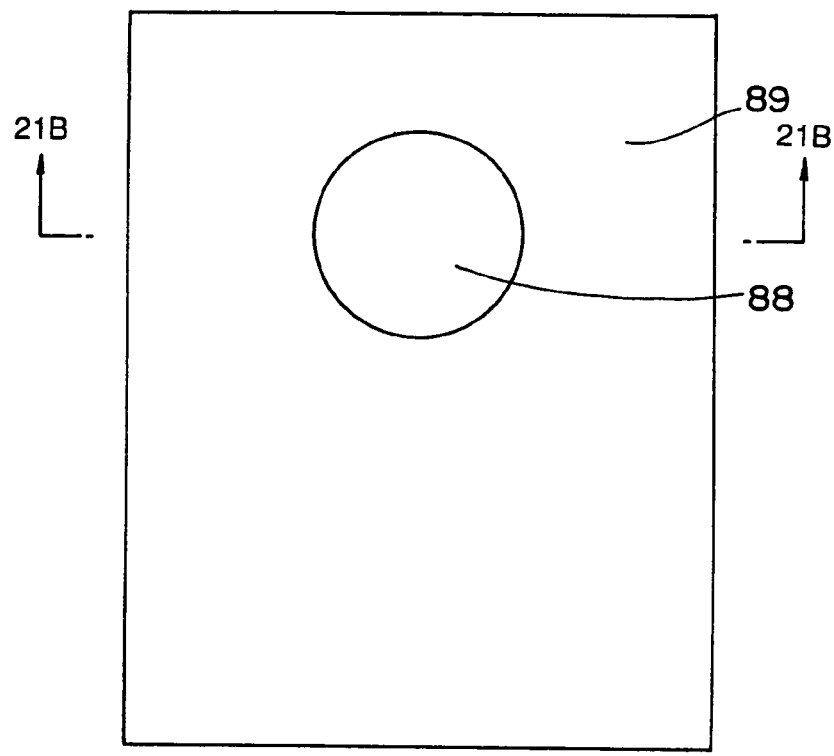
FIGS. 21A and 21B are a plan view and a sectional view taken along the line 21B-21B, respectively, showing manufacturing process of the semiconductor light-emitting device of the fifth embodiment.
Figure 21B:
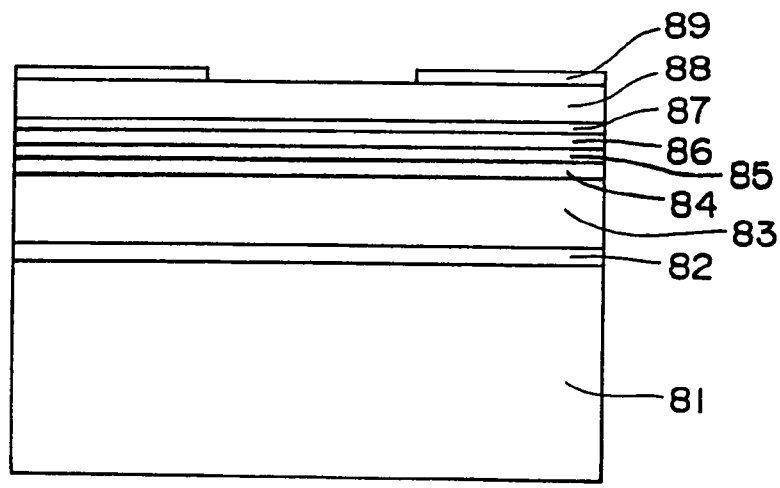
Figure 22A:
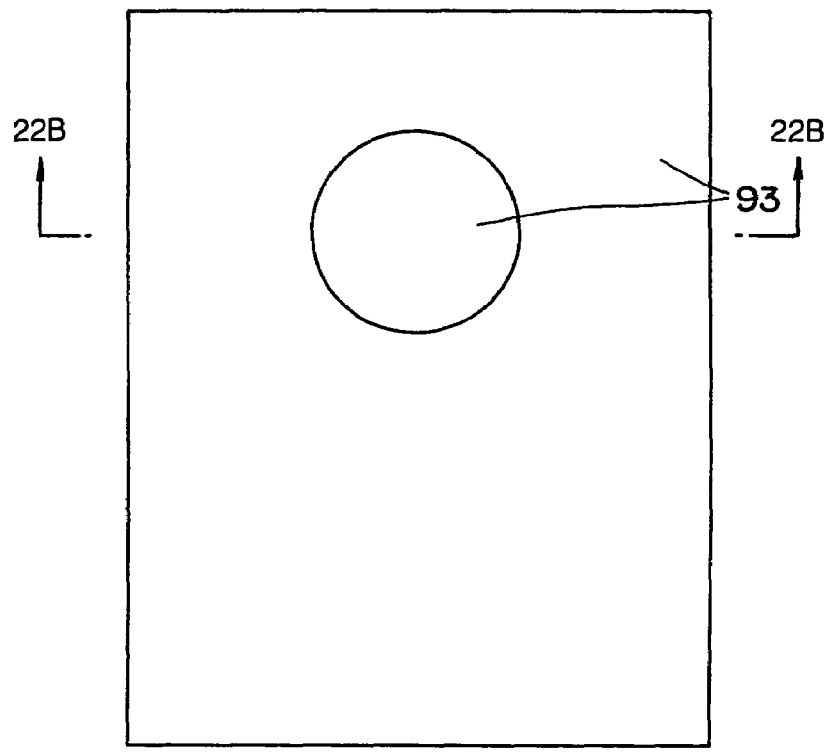
FIGS. 22A and 22B are a plan view and a sectional view taken along the line 22B-22B, respectively, showing manufacturing process of the semiconductor light-emitting device of the fifth embodiment.
Figure 22B:
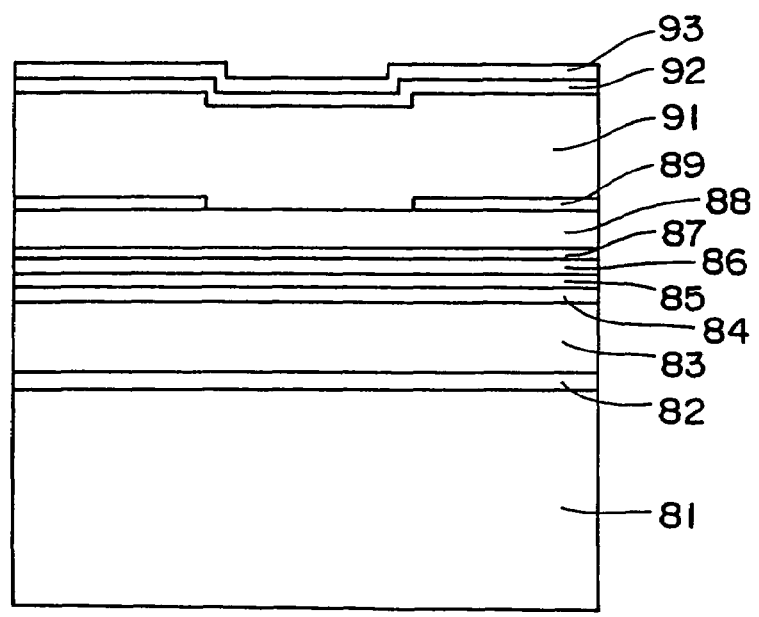
Figure 23A:
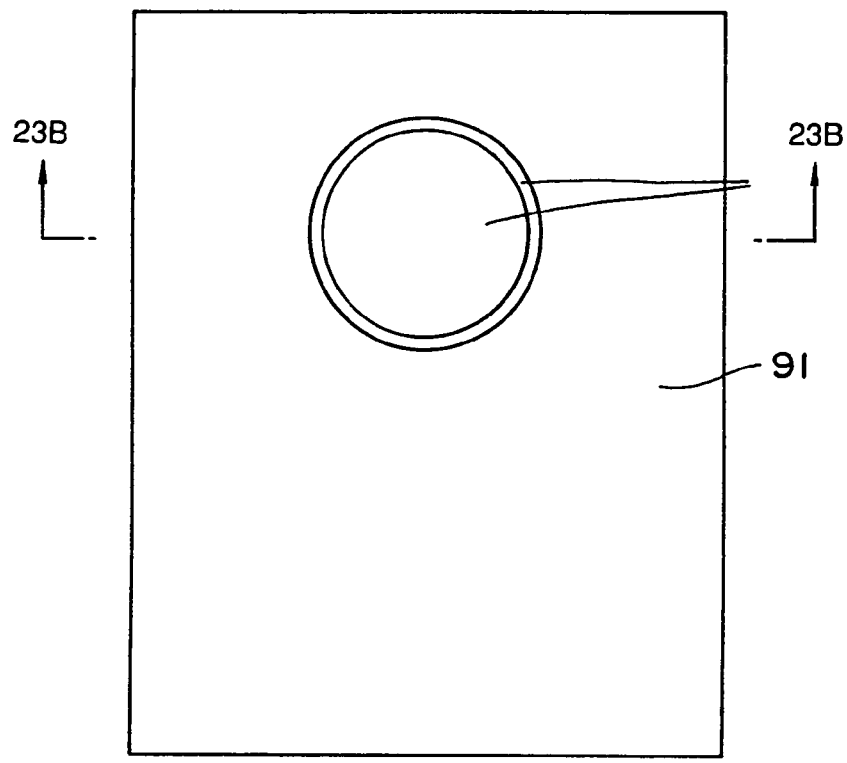
FIGS. 23A and 23B are a plan view and a sectional view taken along the line 23B-23B, respectively, showing manufacturing process of the semiconductor light-emitting device of the fifth embodiment.
Figure 23B:
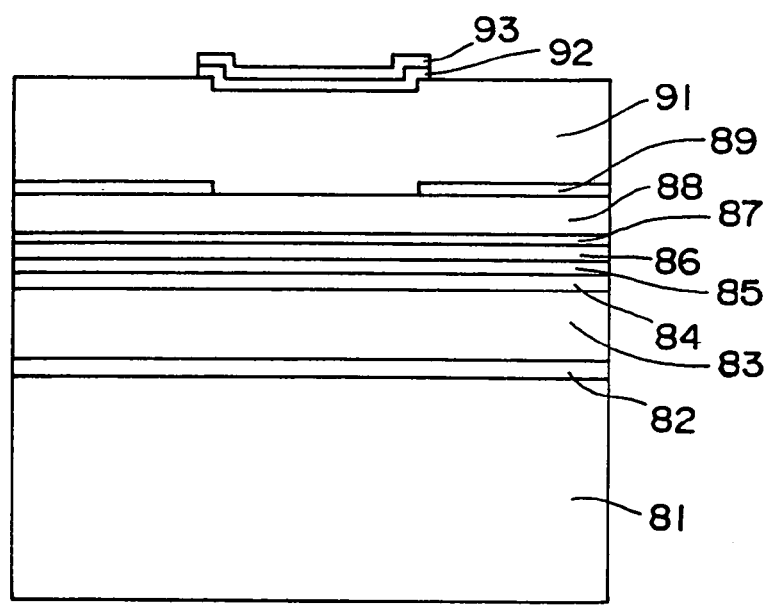
Figure 24:
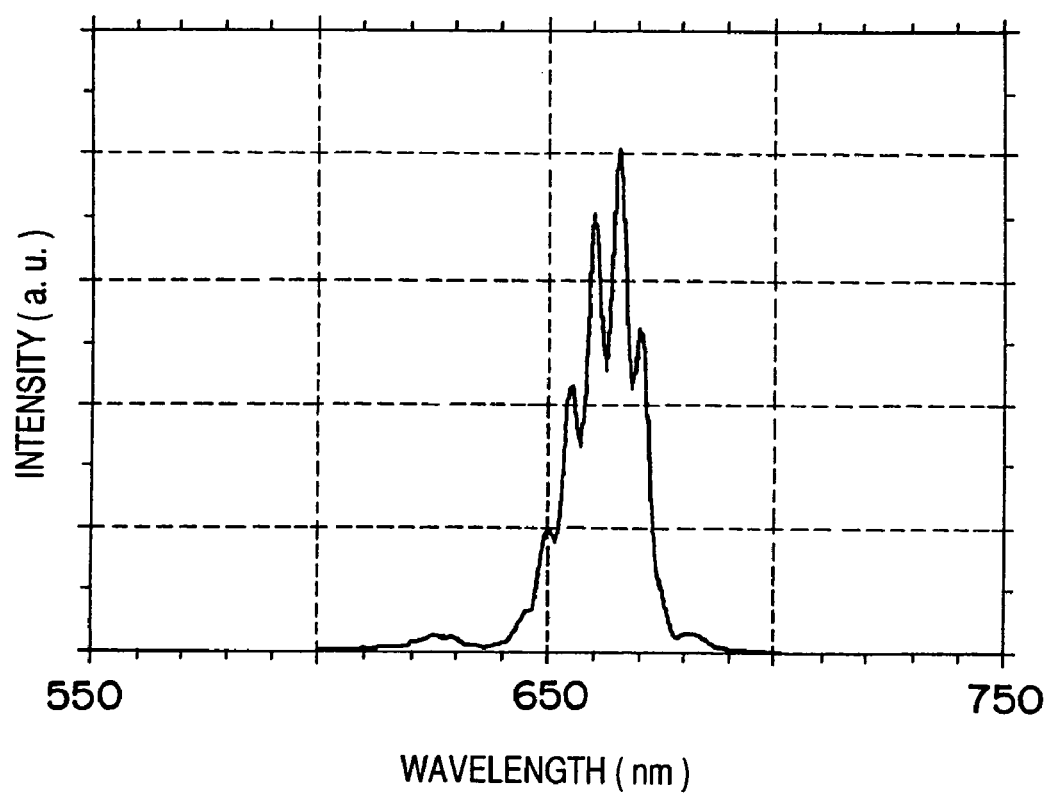
FIG. 24 is a chart showing ripples that occur to an outgoing light spectrum due to an interference of emitted light and reflected light from the DBR in a semiconductor light-emitting device according to the prior art.
Figure 25:
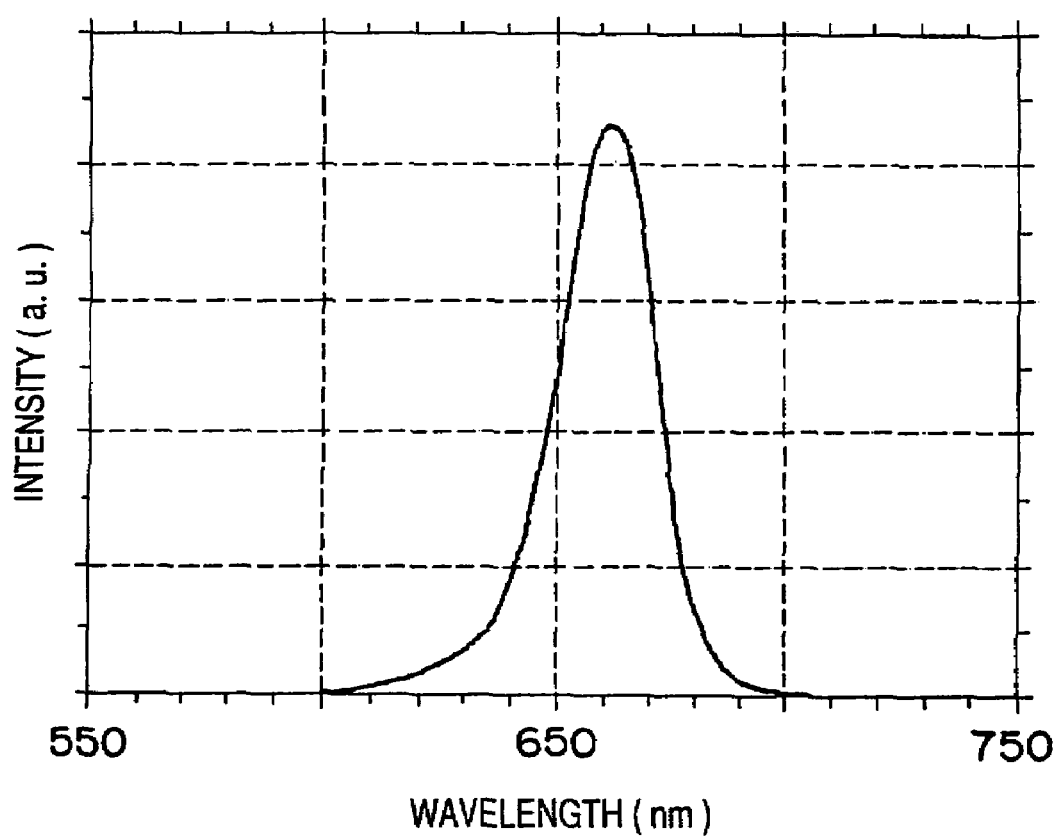
FIG. 25 is a chart showing an outgoing light spectrum of the semiconductor light-emitting device according to the present invention.

FIG. 20, FIGS. 21A and 21B, FIGS. 22A and 22B and FIGS. 23A and 23B show manufacturing process of the semiconductor light-emitting device of FIG. 19, where FIGS. 21B, 22B and 23B are sectional views taken along the lines 21B-21B, 22B-22B and 23B-23B of FIGS. 21A, 22A and 23A, respectively, which are plan views.

In this semiconductor light-emitting device, as shown in FIG. 20, a 1 μm thick n-type GaAs buffer layer 82, a DBR 83 formed by stacking 30 pairs of layers of n-type AlAs and n-type $Al_{0.5}Ga_{0.5}As$ alternately, a first cladding layer 84 made of n-type $Al_{0.5}In_{0.5}P$, a quantum well active layer 85, a second cladding layer 86 made of p-type $Al_{0.5}In_{0.5}P$, a 0.15 μm thick intermediate layer 87 made of p-type AlGaInP, a 1 μm thick first current diffusion layer 88 made of p-type AlGaInP, a 0.3 μm thick current constriction layer 89 made of n-type AlGaInP, and a 0.01 μm thick cap layer 90 made of n-type GaAs are stacked one by one by MOCVD process on an n-type GaAs substrate 81 having a surface whose normal line is inclined by 15° from (100) toward [011].

In this case, the DBR 83 formed of alternately stacked 30 pairs of layers of n-type AlAs and n-type $Al_{0.5}Ga_{0.5}As$ is so made that the reflection spectrum is centered at 650 nm. Also, the light-emission peak wavelength of the quantum well active layer 85 is 650 nm as well.

Next, the n-type GaAs cap layer 90 is removed with a sulfuric acid/hydrogen peroxide based etchant. Thereafter, as shown in FIG. 21, center portion of the current constriction layer 89 of n-type AlGaInP is etched up to the first current diffusion layer 88 of p-type AlGaInP by photolithography and with a sulfuric acid/hydrogen peroxide based etchant, by which a 70 μm-dia. circular-shaped current path is formed.

After that, as shown in FIG. 22B, a 7 μm thick second current diffusion layer 91 of p-type AlGaInP, a 3 μm thick light scattering layer 92 of p-type $Al_{0.6}Ga_{0.4}As$ and a 0.1 μm thick cap layer 93 of p-type GaAs are re-grown one by one on the current constriction layer 89 of n-type AlGaInP and the first current diffusion layer 88 of p-type AlGaInP.

Further, as shown in FIGS. 23A and 23B, the light scattering layer 92 of p-type $Al_{0.6}Ga_{0.4}As$ and the cap layer 93 of p-type GaAs are patterned so that they are left at a 100 μm-dia. size on the 70 μm-dia. current path.

After that, AuBe/Mo/Au is deposited overall so as to cover the cap layer 93 of p-type GaAs and the second current diffusion layer 91 of p-type AlGaInP, and then the AuBe/Mo/Au is etched by photolithography and by etching with a Au etchant and a Mo etchant so that the p-type GaAs cap layer 93 is exposed. Subsequently, the p-type GaAs cap layer 93 is removed with a sulfuric acid/hydrogen peroxide based etchant as shown in FIG. 19B, and the surface of the exposed p-type $Al_{0.6}Ga_{0.4}As$ light scattering layer 92 is treated with dilute hydrofluoric acid so as to be roughened at the surface, and further subjected to heat treatment, by which a p-type electrode 94 is formed on the peripheral portion.

Finally, the rear surface of the GaAs substrate is abraded to about 280 μm, and AuGe/Au is deposited on this abraded surface and then subjected to heat treatment, by which an n-type electrode 95 is formed.

In the semiconductor light-emitting device of the fifth embodiment obtained in this way, since the light scattering layer 92 overlaid on the second current diffusion layer 91 is roughened, the photolithography step for patterning into a circular shape shown in FIG. 23 becomes necessary additionally, as compared with the third embodiment (see FIG. 10), in which the second current diffusion layer 51 is directly roughened. On the other hand, in the semiconductor light-emitting device of the fifth embodiment, since AuBe/Mo/Au including Mo is used as barrier metals as the material of the p-type electrode 94 on the light takeout side, the operating voltage can be lowered, compared with the third embodiment. This is because, in the third embodiment, since the surface roughing is done by boiling in hydrochloric acid due to the need for using AuBe/Au without barrier metals for the p-type electrode 52, the operating voltage is higher by about 0.1 V, compared with the fifth embodiment including barrier metals. Also, in the third embodiment including no barrier metals, Ga included in the lower-layer is diffused into the electrode surface, deteriorating the bondability and lowering the yield. However, such problems do not occur in the fifth embodiment.

On the other hand, the semiconductor light-emitting device of the fifth embodiment has a small radiation angle dependence of emission wavelength, as in the first embodiment described in FIG. 5. Also, since the DBR (Distributed Bragg Reflector) 83 is given by a stack of 30 pairs of AlGaAs based layers made of n-type AlAs and n-type $Al_{0.5}Ga_{0.5}As$, a reflectance of 99% can be achieved and, besides, dislocation in crystals or dark lines and substrate warps are less likely to occur even with the stack of 30 pairs of layers, as compared with the first embodiment using the AlGaInP based DBR 3 having a larger difference in coefficient of thermal expansion from the GaAs substrate.

With this semiconductor light-emitting device, when a 50 mA conduction test was performed at a temperature of 80° C. and a humidity of 85%, a result of a 90% optical output after a 1000-hour elapse, compared with the initial one, and an initial optical output of 1.7 mW at 20 mA were obtained. Further, the operating voltage at 20 mA was 2.2 V, showing that a voltage reduction of 0.1 V was able to be obtained, as compared with the operating voltage of 2.3 V at 20 mA and an emission wavelength of 650 nm in the third embodiment.

In this embodiment, the Al mixed crystal ratio of the AlGaAs light scattering layer 92 has been set to 0.6, taking into consideration that emitted light is absorbed. However, if the light scattering layer is transparent to the emission wavelength, the Al mixed crystal ratio may be set to less than 0.6. It is noted that the mixed crystal ratio is desirably not less than 0.5 from the viewpoint of maintaining the controllability in the surface roughing step, and not more than 0.8 from the viewpoint of maintaining the moisture resistance.

In this embodiment, dilute hydrofluoric acid has been used to roughen the surface of the light scattering layer 92. However, instead of this, dilute nitric acid may be used.

Further, the AlGaAs light scattering layer 92, although having been given as p type in this embodiment, may also be given as undoped or n type as far as the surface is a rough surface and scatters light.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light-emitting device comprising:
   a DBR (Distributed Bragg Reflector) and a light-emitting layer supported by at least a substrate comprising GaAs, the DBR being located between the substrate comprising GaAs and the light-emitting layer, wherein light directed from the light-emitting layer toward a top surface of the light-emitting device has a radiation angle dependence;
   a semiconductor layer formed over at least the light-emitting layer, a top surface of the semiconductor layer comprising a roughened surface which is not at least partially covered by the other semiconductor layers in order to cause light output from the light-emitting device to be scattered upon leaving the top surface of the device;
   wherein no DBR is provided between the light-emitting layer and the semiconductor layer having the top surface that is roughened; and
   wherein a top electrode of the device includes a plurality of separate apertures defined therein so as to expose different parts of the roughened surface of the semiconductor layer.

2. The semiconductor light-emitting device according to claim 1, wherein the light-emitting layer to be formed on the GaAs substrate is a single layer or a plurality of layers made of $Al_yGa_zIn_{1-y-z}P$ ($0 \leq y \leq 1$, $0 \leq z \leq 1$).

3. The light-emitting device of claim 1, wherein the semiconductor with roughened surface has a lattice constant different by 0.5% or more than that of the substrate comprising GaAs.

4. The light-emitting device of claim 1, wherein no mirror/reflector is provided between the light-emitting layer and the semiconductor layer having the top surface that is roughened.

5. The semiconductor light-emitting device according to claim 1, wherein the layer whose top surface is a roughened surface is made of $Al_yGa_zIn_{1-y-z}P$ ($0 \leq y \leq 1$, $0 \leq z \leq 1$).

6. The semiconductor light-emitting device according to claim 5, wherein the layer whose top surface is a roughened surface has a lattice constant different by 0.5% or more from that of the GaAs substrate.

7. The semiconductor light-emitting device according to claim 1, wherein the semiconductor layer whose top surface is a roughened surface is made of $Al_xGa_{1-x}As$ ($0 \leq x \leq 1$).

8. The semiconductor light-emitting device according to claim 7, wherein the semiconductor layer made of $Al_xGa_{1-x}As$ ($0 \leq x \leq 1$) is transparent to an emission wavelength.

9. The semiconductor light-emitting device according to claim 7, wherein the semiconductor layer made of $Al_xGa_{1-x}As$ ($0 \leq x \leq 1$) has an Al mixed crystal ratio x of 0.5-0.8.

10. The semiconductor light-emitting device according to claim 7, further comprising an $Al_yGa_zIn_{1-y-z}P$ ($0 \leq y \leq 1$, $0 \leq z \leq 1$) layer for diffusing a current injected from an electrode provided on a light takeout side, the $Al_yGa_zIn_{1-y-z}P$ layer being provided between the semiconductor layer made of $Al_xGa_{1-x}As$ ($0 \leq x \leq 1$) and the light-emitting layer.

11. A semiconductor light-emitting device comprising:

a DBR (Distributed Bragg Reflector) and a light-emitting layer supported by a substrate comprising GaAs, the DBR being located closer to the substrate comprising GaAs than is the light-emitting layer; and a semiconductor layer formed on the light-emitting layer, and wherein at least part of a top surface of the semiconductor layer is roughened so as to define a roughened surface which is not at least partially covered by the other semiconductor layers in order to cause light output from the light-emitting device to be scattered upon leaving the top surface of the device;

wherein no DBR is provided between the light-emitting layer and the semiconductor layer having, the top surface that is roughened; and wherein a top electrode of the device includes a plurality of separate apertures defined therein so as to expose different parts of the roughened surface of the semiconductor layer.

12. The semiconductor light-emitting device according to claim 11, wherein the light-emitting layer is a single layer or a plurality of layers comprising $Al_yGa_zIn_{1-y-z}P$ ($0 \leq y \leq 1$, $0 \leq z \leq 1$).

13. The device of claim 11, further comprising a current diffusion layer located between at least the light-emitting layer and the semiconductor having the top surface that is roughened, and an etch stop layer provided between the current diffusion layer and said semiconductor layer having the top surface that is roughened.

14. The device of claim 11, wherein the device includes only one DBR.

15. The light-emitting device of claim 11, wherein the semiconductor with roughened surface has a lattice constant different by 0.5% or more than that of the substrate comprising GaAs.

16. The light-emitting device of claim 11, wherein no mirror/reflector is provided between the light-emitting layer and the semiconductor layer having the top surface that is roughened.

17. The semiconductor light-emitting device according to claim 11, wherein the semiconductor layer whose top surface is a roughened surface comprises $Al_xGa_{1-x}As$ ($0 \leq x \leq 1$).

18. The semiconductor light-emitting device according to claim 17, wherein the semiconductor layer comprising $Al_xGa_{1-x}As$ ($0 \leq x \leq 1$) is transparent to an emission wavelength.

* * * * *